(12) United States Patent
McKay et al.

(10) Patent No.: US 9,061,344 B1
(45) Date of Patent: Jun. 23, 2015

(54) APPARATUSES AND METHODS FOR FABRICATING WIRE CURRENT COLLECTORS AND INTERCONNECTS FOR SOLAR CELLS

(75) Inventors: Douglas J. McKay, San Jose, CA (US); John W. Zevenbergen, IV, San Francisco, CA (US); Darin Birtwhistle, San Francisco, CA (US); Robert Janning, Mountain View, CA (US); Mitch Janning, Mountain View, CA (US)

(73) Assignee: Apollo Precision (Fujian) Limited, Quanzhou (CN)

( * ) Notice: Subject to any disclaimer, the term of this patent is extended or adjusted under 35 U.S.C. 154(b) by 882 days.

(21) Appl. No.: 13/114,999

(22) Filed: May 24, 2011

Related U.S. Application Data

(60) Provisional application No. 61/348,640, filed on May 26, 2010.

(51) Int. Cl.
*B21F 1/04* (2006.01)
*B21D 11/06* (2006.01)

(52) U.S. Cl.
CPC .. *B21F 1/04* (2013.01); *B21D 11/06* (2013.01)

(58) Field of Classification Search
CPC .......... B21F 1/04; B21F 23/00; B21D 11/06; B21D 11/07
USPC ............... 140/1, 34, 35, 48, 71 R, 92.5, 93 R, 140/102.5, 113, 117, 123; 72/405.03, 422, 72/423
See application file for complete search history.

(56) References Cited

U.S. PATENT DOCUMENTS

| | | | | |
|---|---|---|---|---|
| 2,782,809 | A * | 2/1957 | Smallridge | 140/92.1 |
| 2,963,048 | A * | 12/1960 | Smith | 140/71 R |
| 3,025,889 | A * | 3/1962 | Clay | 140/71 R |
| 3,459,391 | A | 8/1969 | Haynos | |
| 3,553,030 | A | 1/1971 | Lebrun | |
| 3,561,500 | A | 2/1971 | Rentz et al. | |
| 3,713,893 | A | 1/1973 | Shirland | |

(Continued)

FOREIGN PATENT DOCUMENTS

| | | |
|---|---|---|
| CA | 2718518 | 9/2009 |
| DE | 2757301 | 7/1979 |

(Continued)

OTHER PUBLICATIONS

U.S. Appl. No. 12/052,476, "Interconnect assembly", Zerfu et al., filed Mar. 20, 2008.

(Continued)

*Primary Examiner* — Teresa M Ekiert
(74) *Attorney, Agent, or Firm* — Weaver Austin Villeneuve & Sampson LLP

(57) ABSTRACT

Provided herein are high throughput apparatuses for fabricating wire current collector and/or interconnect assemblies for solar cells. In certain embodiments, the wire assemblies include uniformly pitched serpentine wires. According to various embodiments, the apparatuses include a plurality of link heads connected to collapsible links, with the heads spaced apart when the links are in an uncollapsed position and stacked when the links are in a collapsed position. Alternating link heads engage opposite sides of the wire such that, when collapsed, the wire is threaded through engaging members of the heads in a serpentine configuration.

20 Claims, 19 Drawing Sheets

(56) References Cited

U.S. PATENT DOCUMENTS

| | | |
|---|---|---|
| 4,017,332 A | 4/1977 | James |
| 4,166,918 A | 9/1979 | Nostrand et al. |
| 4,346,159 A | 8/1982 | Sadamatsu et al. |
| 4,366,335 A | 12/1982 | Feng et al. |
| 4,560,498 A | 12/1985 | Horsma et al. |
| 4,567,642 A | 2/1986 | Dilts et al. |
| 4,598,306 A | 7/1986 | Nath et al. |
| 4,640,002 A | 2/1987 | Phillips et al. |
| 4,694,117 A | 9/1987 | Friedrich et al. |
| 4,849,133 A | 7/1989 | Yoshida et al. |
| 5,034,068 A | 7/1991 | Glenn et al. |
| 5,330,583 A | 7/1994 | Asai et al. |
| 5,391,235 A | 2/1995 | Inoue |
| 5,474,621 A | 12/1995 | Barnard |
| 5,554,229 A | 9/1996 | Vogeli |
| 5,620,528 A | 4/1997 | Schade et al. |
| 5,626,688 A | 5/1997 | Probst et al. |
| 5,681,402 A | 10/1997 | Ichinose et al. |
| 5,814,195 A | 9/1998 | Lehan et al. |
| 5,861,324 A | 1/1999 | Ichinose et al. |
| 6,093,581 A | 7/2000 | Takabayashi |
| 6,093,884 A | 7/2000 | Toyomura et al. |
| 6,121,542 A | 9/2000 | Shiotsuka et al. |
| 6,132,585 A | 10/2000 | Midorikawa et al. |
| 6,184,458 B1 | 2/2001 | Murakami et al. |
| 6,231,732 B1 | 5/2001 | Hollars et al. |
| 6,335,479 B1 | 1/2002 | Yamada et al. |
| 6,365,010 B1 | 4/2002 | Hollars |
| 6,372,538 B1 | 4/2002 | Wendt et al. |
| 6,479,744 B1 | 11/2002 | Tsuzuki et al. |
| 6,488,824 B1 | 12/2002 | Hollars et al. |
| 6,531,653 B1 | 3/2003 | Glenn et al. |
| 6,548,912 B1 | 4/2003 | Graff et al. |
| 6,600,100 B2 | 7/2003 | Ho et al. |
| 6,657,119 B2 | 12/2003 | Lindquist et al. |
| 6,743,524 B2 | 6/2004 | Schaepkens |
| 6,803,513 B2 | 10/2004 | Beernink et al. |
| 7,544,884 B2 | 6/2009 | Hollars |
| 8,138,413 B2 | 3/2012 | Luch et al. |
| 8,356,324 B2 | 1/2013 | Rajakarunanayake |
| 8,356,640 B1 | 1/2013 | Nizenkoff et al. |
| 8,912,429 B2 | 12/2014 | Wudu et al. |
| 8,951,824 B1 | 2/2015 | Krajewski |
| 2002/0014262 A1 | 2/2002 | Matsushita et al. |
| 2002/0166580 A1 | 11/2002 | Bauman et al. |
| 2004/0063320 A1 | 4/2004 | Hollars |
| 2004/0069340 A1 | 4/2004 | Luch |
| 2004/0118448 A1 | 6/2004 | Scher et al. |
| 2004/0144043 A1 | 7/2004 | Stevenson et al. |
| 2004/0187917 A1 | 9/2004 | Pichler |
| 2005/0072461 A1 | 4/2005 | Kuchinski et al. |
| 2005/0074915 A1 | 4/2005 | Tuttle et al. |
| 2005/0109392 A1 | 5/2005 | Hollars |
| 2005/0176270 A1 | 8/2005 | Luch |
| 2005/0241692 A1 | 11/2005 | Rubin et al. |
| 2006/0032752 A1 | 2/2006 | Luch |
| 2006/0180195 A1 | 8/2006 | Luch |
| 2006/0207646 A1 | 9/2006 | Terreau |
| 2007/0283996 A1 | 12/2007 | Hachtmann et al. |
| 2007/0283997 A1 | 12/2007 | Hachtmann et al. |
| 2007/0295385 A1 | 12/2007 | Sheats et al. |
| 2008/0000518 A1 | 1/2008 | Basol |
| 2008/0011350 A1 | 1/2008 | Luch |
| 2008/0053511 A1 | 3/2008 | Nakamura |
| 2008/0053519 A1 | 3/2008 | Pearce et al. |
| 2008/0128018 A1 | 6/2008 | Hayes |
| 2008/0142071 A1 | 6/2008 | Dorn et al. |
| 2008/0213477 A1 | 9/2008 | Zindel et al. |
| 2008/0314432 A1 | 12/2008 | Paulson et al. |
| 2008/0314433 A1 | 12/2008 | Luch |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0111206 A1 | 4/2009 | Luch |
| 2009/0199894 A1 | 8/2009 | Hollars et al. |
| 2009/0235979 A1 | 9/2009 | Wudu et al. |
| 2009/0297803 A1 | 12/2009 | Kriha et al. |
| 2010/0043863 A1 | 2/2010 | Wudu et al. |
| 2010/0108122 A1 | 5/2010 | Everson et al. |
| 2010/0122730 A1 | 5/2010 | Corneille et al. |
| 2010/0130348 A1 | 5/2010 | Kang et al. |
| 2010/0212733 A1 | 8/2010 | Schmidt et al. |
| 2011/0143077 A1 | 6/2011 | Kakihara et al. |
| 2011/0197947 A1 | 8/2011 | Croft et al. |
| 2011/0207328 A1 | 8/2011 | Speakman |
| 2012/0000510 A1 | 1/2012 | Wiedeman et al. |
| 2012/0080079 A1 | 4/2012 | Corneille et al. |
| 2012/0125393 A1 | 5/2012 | Austin et al. |
| 2012/0138117 A1 | 6/2012 | Krajewski |
| 2013/0276855 A1 | 10/2013 | Wudu et al. |

FOREIGN PATENT DOCUMENTS

| | | |
|---|---|---|
| EP | 1868250 | 5/2010 |
| JP | 06-021501 | 1/1994 |
| JP | 07-099334 | 4/1995 |
| JP | 09-036404 | 2/1997 |
| JP | 10-093125 | 4/1998 |
| JP | 2000-269531 | 9/2000 |
| JP | 2004-253475 | 9/2004 |
| JP | 2005-129773 | 5/2005 |
| JP | 2006-041351 | 2/2006 |
| KR | 10-1999-006965 | 1/1999 |
| KR | 10-0242852 | 2/2000 |
| WO | 2010/056803 | 5/2010 |
| WO | 2012/047553 | 4/2012 |

OTHER PUBLICATIONS

WO patent application No. PCT/US2009/035486, International Search Report and Written Opinion, mailed Sep. 29, 2009.

U.S. Appl. No. 12/566,555, "Interconnect Assembly", Wudu et al., filed Sep. 24, 2009.

U.S. Appl. No. 12/272,600, "Power-loss-inhibiting current-collector", Corneille et al., filed Nov. 17, 2008.

U.S. Appl. No. 12/837,867, "Transparent conductive film-coated decals for solar cells", Corneille et al., filed Jul. 16, 2010.

U.S. Appl. No. 12/819,124, "Power-loss-inhibiting current collector having transparent current regulator", Corneille et al., filed Jun. 18, 2010.

U.S. Appl. No. 12/843,648, "Temperature resistant current collectors for thin film photovoltaic cells", Alex Austin, filed Jul. 26, 2010.

US patent application No. PCT/US2009/064125, International Search Report and Written Opinion, mailed May 24, 2010.

U.S. Appl. No. 12/272,600, Office Action mailed Apr. 14, 2011.

U.S. Appl. No. 12/897,162, "Small gauge wire solar cell interconnect", Corneille et al., filed Oct. 4, 2010.

U.S. Appl. No. 12/052,476, Office Action mailed Jan. 21, 2011.

U.S. Appl. No. 12/052,476, Office Action mailed Aug. 3, 2011.

U.S. Appl. No. 12/272,600, Office Action mailed Oct. 18, 2011.

U.S. Appl. No. 12/687,754, "Apparatuses and methods for fabricating wire current collectors and interconnects for solar cells", Nizenkoff et al., filed Jan. 14, 2010.

U.S. Appl. No. 12/915,882, "Apparatus and method for securing wire to decal", McKay et al., filed Oct. 29, 2010.

U.S. Appl. No. 13/082,709, "Adhesives for attaching wire network to photovoltaic cells", Todd Krajewski, filed Apr. 8, 2011.

U.S. Appl. No. 13/085,274, "Thermoplastic wire network support for photovoltaic cells", Todd Krajewski, Apr. 12, 2011.

U.S. Appl. No. 13/087,724, "Wire network for interconnecting photovoltaic cells", Steven Croft, filed Apr. 15, 2011.

U.S. Appl. No. 13/087,730, "Interconnecting wire network with conductive tab", Steven Croft, filed Apr. 15, 2011.

U.S. Appl. No. 11/451,616, Office Action mailed Sep. 17, 2009.

U.S. Appl. No. 11/451,616, Office Action mailed Apr. 20, 2010.

U.S. Appl. No. 12/951,711, "Photovoltaic Device and Method and System for Making Photovoltaic Device," Austen, filed Nov. 22, 2010.

Untila et al., "19.2% Efficient Bifacial ITO-($P^+Nn^+$)Si-ITO Laminated Grid Cell, $16^{th}$ European Photovoltaic Solar Energy Conference," May 1-5, 2000, Glasgow, UK, pp. 1489-1491.

(56) References Cited

OTHER PUBLICATIONS

Richards et al., "Enhancing the efficiency of production CdS/CdTe PV modules by overcoming poor spectral response at short wavelengths via luminescence down-shifting," 2006 IEEE 4$^{th}$ World Conference on Photovoltaic Energy Conversion, May 7-12, 2006, 4 pages.
U.S. Appl. No. 11/451,604, Final Office Action mailed Apr. 1, 2010.
U.S. Appl. No. 11/451,604, Office Action mailed Sep. 4, 2009.
EP patent application No. 07252359.0, Examination Report mailed Jul. 10, 2008.
U.S. Appl. No. 12/052,476, Office Action mailed Mar. 16, 2012.
U.S. Appl. No. 12/052,476, Notice of Allowance mailed Jul. 18, 2012.
U.S. Appl. No. 12/566,555, Office Action mailed Feb. 16, 2012.
U.S. Appl. No. 12/915,882, Office Action mailed Jul. 20, 2012.
International Search Report and Written Opinion mailed Apr. 24, 2012 for application No. PCT/US2011/052974.
U.S. Appl. No. 12/837,867, Office Action mailed Aug. 8, 2012.
U.S. Appl. No. 12/566,555, Office Action mailed Sep. 28, 2012.
U.S. Appl. No. 12/819,124, Ofice Action mailed Oct. 9, 2012.
U.S. Appl. No. 12/272,600, Office Action mailed Oct. 10, 2012.
U.S. Appl. No. 12/052,476, Office Action mailed May 31, 2013.
U.S. Appl. No. 13/850,976, "Interconnect Assembly", Wudu et al., filed Mar. 26, 2013.
Notice of Allowance dated Sep. 18, 2012, for U.S. Appl. No. 12/687,754.
Office Action dated Dec. 6, 2012, for U.S. Appl. No. 12/843,648.
Shimomura, JP 2006-041351A, Machine Translation.
Office Action mailed Jun. 7, 2013 for U.S. Appl. No. 12/897,162.
Huisman, et al., "The application of inverse titania opals in nanostructured solar cells," Jun. 1, 2004, Elsevier, Solar Energy Material & Solar Cells, 85 (2005), pp. 115-124.
Reynolds, Phillip John, "A Surly Ionomer as a self-healing and self-sensing composite," Dec. 2011, University of Bomingham, p. 10.
Sigma-Aldrich, Material Safety Data Sheet Poly (ethylene terephthalate), Dec. 18, 2012, Sigma-Aldrich, Version 4.2.
Sigma-Aldrich, Material Safety Data Sheet Poly (ethylene-co-matheacryilic acid), Jul. 20, 2010, Sigma-Aldrich, Version 4.0.
US Office Action mailed Aug. 1, 2013, issued in U.S. Appl. No. 13/085,274.
Kay, et al. Low Cost Photovoltaic Modules Based on Dye Sensitized Nanocrystalline Titanium Dioxide and Carbon Powder, Solar Energy Materials and Solar Cells, 1996, 19 pages.
DuPont, Teflon FEP 100 Material Safety Data Sheet, 2013, 2 pages.
U.S. Appl. No. 13/082,709, Office Action mailed Nov. 1, 2013.
U.S. Appl. No. 13/087,724, Office Action mailed Nov. 6, 2013.
U.S. Appl. No. 12/052,476, Office Action mailed Feb. 7, 2014.
U.S. Appl. No. 13/085,274, Office Action mailed Apr. 11, 2014.
U.S. Appl. No. 12/052,476, Office Action mailed May 2, 2014.
U.S. Appl. No. 12/687,754, Notice of Allowance mailed Sep. 18, 2012.
U.S. Appl. No. 13/087,724, Final Office Action mailed Jun. 12, 2014.
U.S. Appl. No. 13/082,709, Office Action mailed Jun. 17, 2014.
U.S. Appl. No. 12/052,476, Notice of Allowance mailed Aug. 14, 2014.
Final Office Action mailed Sep. 5, 2014 for U.S. Appl. No. 12/897,162.
U.S. Appl. No. 13/087,730, Office Action mailed Jun. 25, 2014.
U.S. Appl. No. 11/451,616, Office Action mailed Jun. 6, 2014.
U.S. Appl. No. 11/451,604, Office Action mailed Jun. 6, 2014.
U.S. Appl. No. 14/539,876, "Interconnect Assembly," Wudu et al., filed Nov. 12, 2014.
U.S. Appl. No. 13/082,709, Notice of Allowance mailed Oct. 6, 2014.
U.S. Appl. No. 13/085,274, Office Action mailed Dec. 26, 2014.

* cited by examiner

APPARATUSES AND METHODS FOR FABRICATING WIRE CURRENT COLLECTORS AND INTERCONNECTS FOR SOLAR CELLS

CROSS-REFERENCE TO RELATED APPLICATION

This application claims the benefit of priority under 35 U.S.C. §119(e) to U.S. Provisional Application 61/348,640 entitled "APPARATUSES AND METHODS FOR FABRICATING WIRE CURRENT COLLECTORS AND INTERCONNECTS FOR SOLAR CELLS," filed May 26, 2010, all of which is incorporated herein in its entirety by this reference.

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect. Certain photovoltaic cell fabrication processes involve depositing thin film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current throughout the cell. In one example of a fabrication process, a metallic back electrical contact layer is deposited on a substrate. A p-type semiconductor layer is then deposited on the back contact electrical contact layer and an n-type semiconductor layer is deposited on the p-type semiconductor layer to complete a p-n junction. Any suitable semiconductor materials, such as CIGS, CIS, CdTe, CdS, ZnS, ZnO, amorphous silicon, polycrystalline silicon, etc. may be used for these layers. A top transparent electrode layer is then deposited on the p-n junction. This layer may be a conductive oxide or other conductive film and is used for current collection. Once these or other materials have been deposited on the substrate to form a photovoltaic stack, the substrate and thin film materials deposited on it are cut into cells. Multiple cells are then assembled into a solar module.

SUMMARY OF THE INVENTION

Provided herein are high throughput apparatuses for fabricating wire current collector and/or interconnect assemblies for solar cells. In certain embodiments, the wire assemblies include uniformly pitched serpentine wires. According to various embodiments, the apparatuses include a plurality of link heads connected to collapsible links, with the heads spaced apart when the links are in an uncollapsed position and stacked when the links are in a collapsed position. Alternating link heads engage opposite sides of the wire such that, when collapsed, the wire is threaded through engaging members of the heads in a serpentine configuration.

One aspect relates to an apparatus for forming a serpentine current collector for a solar cell, including a wire feed apparatus configured to feed wire from a spool, a recirculation path including a collapsed link section, a chain of collapsible links configured to circulate around the recirculation path, and a plurality of link heads connected to collapsible links. The link heads are spaced apart when the links are in an uncollapsed position and stacked when the links are in a collapsed position, with the said link heads configured to engage the wire from the wire feed apparatus. Adjacent link heads engage opposite sides of the wire such that, when the links are collapsed, the wire is threaded through engaging members of the heads in a serpentine configuration.

In some embodiments, each link head includes two engaging members. The engaging members can be movable between an opened position and a closed position, with the members in a closed position defining a wire confinement area. In certain embodiments, each link head includes dual activation surfaces symmetric about a pivot point. A force exerted against either of the activation surfaces is operable to move the engaging members into the opened position. In certain embodiments, when in the opened position, the engaging members are below the plane of the wire confinement area. Also in certain embodiments, one of the two engaging members is electrically conductive and the other of the two engaging members is electrically insulative.

In some embodiments, the link heads are arranged in alternating orientations, such that every other link head is facing the same direction. The alternating orientations can be 180° around an axis of the link head. In some embodiments, the apparatus further includes upper and lower rotatable drum assemblies around which the chain rotates. The upper drum assembly can include grooves, such as v-shaped grooves, configured to receive and align link heads. The upper drum assembly may also include a halo with protruding wire guides to receive the wire from the wire feed apparatus. In some embodiments, the upper drum assembly includes a stationary cam rail and grabbers configured to activate the link heads in the v-shaped grooves to thereby move the engaging members into an opened position.

In some embodiments, the apparatus further includes a guide track assembly configured to collapse and guide the links in the collapsed link section of the recirculation path. The guide track assembly can be further configured to release the formed serpentine wire from the link heads. The guide track assembly can include bifurcated channel having two sub-channels, with each sub-channel configured to guide a stack of link heads. The guide track assembly can further include a link head spreader disposed between the two sub-channels configured to align links of each of two stacks of link heads. In some embodiments, the apparatus includes a double cam assembly configured to open collapsed link heads to release the serpentine wire. In some embodiments, a recirculation path further includes a heating section in which the wire is heated. The apparatus can further include a decal feed configured to apply a decal to one side of the serpentine wire.

The apparatus can include a set of upper sprockets configured to compress the collapsed links. The upper sprockets can exert pressure of at least about 10 psi on the collapsed links. In some embodiments, the apparatus can include pneumatic cylinders configured to exert pneumatic force on the link heads to reduce link head diving during link collapse.

Another aspect relates to a wire containment apparatus including a wire feed apparatus configured to feed wire from a spool, and a wire containment component configured to grab wire fed from the spool. Each wire containment component can include two engaging members, both movable between an opened position and a closed position, with the members in a closed position defining a wire confinement area; and dual activation surfaces symmetric about a pivot point, wherein a force exerted against either of said activation surface is operable to move the engaging members into the opened position. In some embodiments, in the opened position, the engaging members are below the plane of the wire confinement area.

These and other aspects of the invention are described further below with reference to the figures.

DETAILED DESCRIPTION OF THE PREFERRED EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. For example, while description below refers chiefly to fabricating wire assemblies used solar cell current collectors and/or interconnects, the apparatuses and methods herein are not so limited and extend to wire assembly fabrication in other fields. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Figure 1:
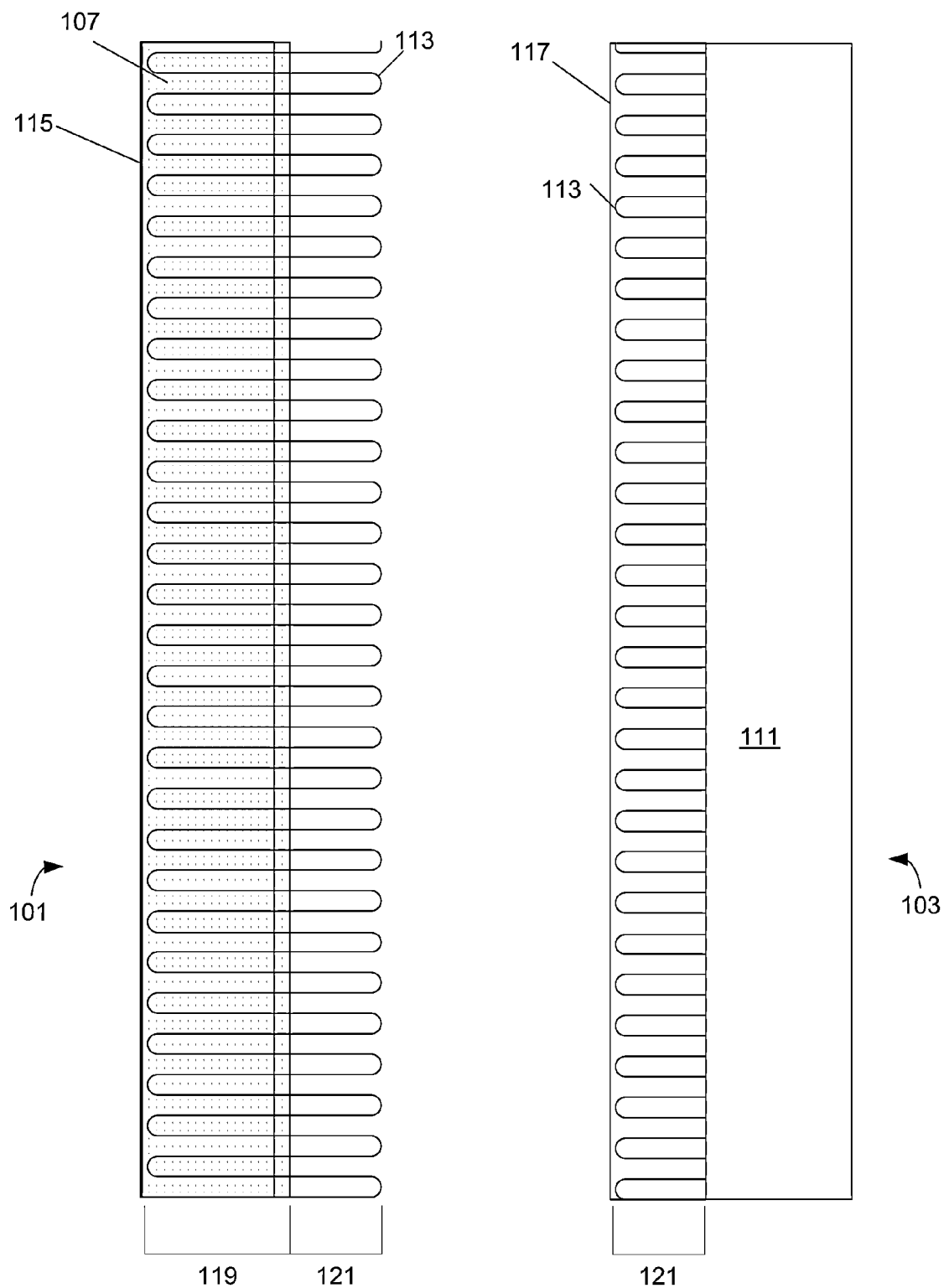
FIG. 1 depicts front and back views of a solar cell including a current collector and interconnect wire according to certain embodiments.
Figure 2:
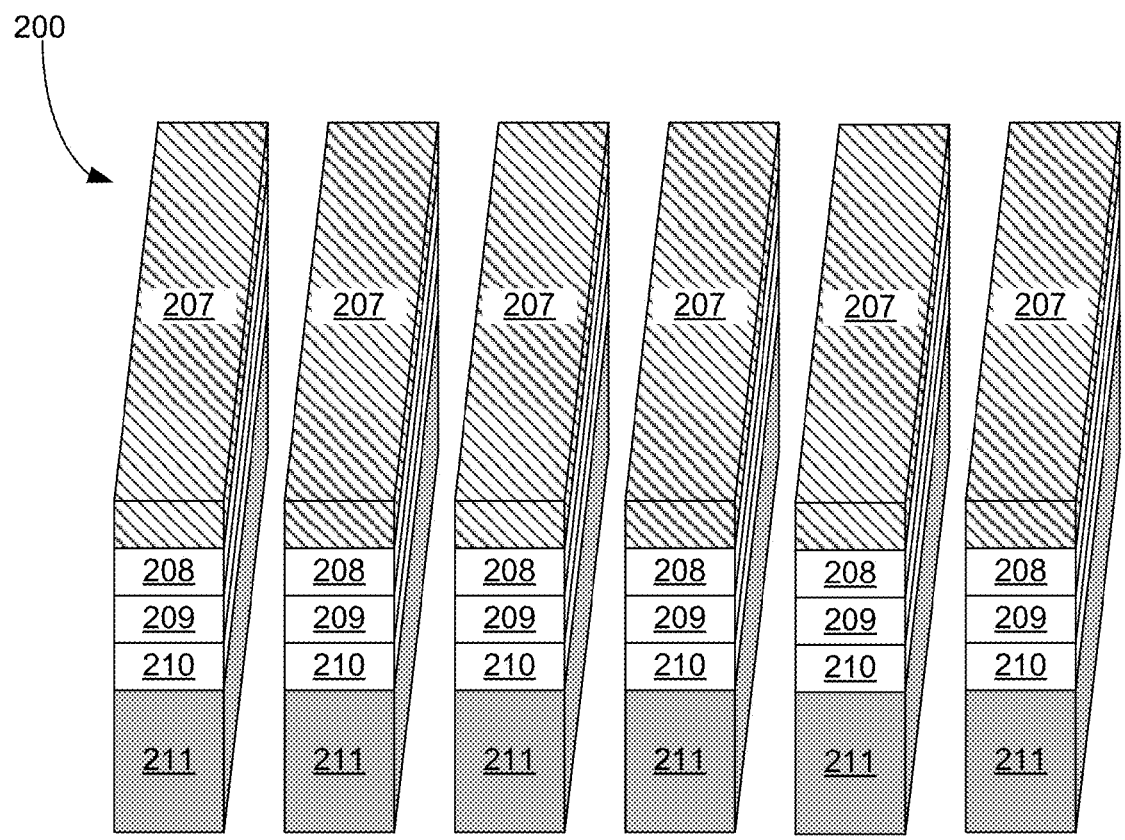
FIG. 2 is a schematic illustration of thin film solar cell stacks according to certain embodiments.

Provided herein are apparatuses and methods for fabricating wire current collectors and interconnects for solar cells. FIG. 1 shows front (101) and back (103) views of a thin film solar cell, including a wire current collector/interconnect assembly. Front view 101 shows the front, or light facing, side of the solar cell including a conductive transparent top layer 107, and back view 103 shows a metallic substrate 111 supporting a thin film solar cell stack. An example of a thin film solar cell stack is depicted in FIG. 2, which shows a perspective view of cell-width strips 200 of thin film solar cell stacks. Substrate 211 supports thin films 210, 209, 208 and 207. Layers 208 and 209 form a p-n junction, with a p-type semiconductor layer 209 deposited on a back electrical contact layer 210 and an n-type semiconductor layer 208 deposited on p-type semiconductor layer 209 to complete a p-n junction. According to various embodiments, any suitable semiconductor materials, such as CIGS, OS, CdTe, CdS, ZnS, ZnO, amorphous silicon, polycrystalline silicon, etc. are used for layers 208 and 209. For example, the p-type semiconductor layer 209 may be CIGS or CIS, and the n-type semiconductor layer 208 may be CdS or a cadmium free material, such as ZnS, ZnO, etc. Top electrode layer 207 overlays the p-n junction. It is transparent, allowing light to reach light absorbing layer 209. In certain embodiments, top transparent electrode layer 207 is a transparent conducting oxide (TCO), for example, zinc oxide, aluminum-doped zinc oxide (AZO), indium tin oxide (ITO) and gallium doped zinc oxide. Back electrical contact layer 210 provides electrical contact to allow electrical current to flow through the solar cell, and may be made of any appropriate material, e.g., molybdenum, niobium, copper, silver, etc. As indicated above, in certain embodiments, substrate 211 is a metallic substrate, e.g., a thin stainless steel foil, though it may also be other metals including but not limited to, titanium, copper, aluminum, beryllium and the like. The substrate 211 may be relatively thin, such as for example, less than or equal to about 2-10 mils, though suitable thicknesses may also be used. In many cases the substrate is thin enough to be flexible. As indicated, the stacks 200 shown in FIG. 2 are long cell width strips, which may be cut further to define individual cells as shown in FIG. 1. The thin film solar cells stacks shown in FIG. 2 are provided for context and not intended to be limiting. For example, the wire current collectors and/or interconnects described herein may be used with other types of solar cells as well as in other fields.

Returning to FIG. 1, the wire assembly includes serpentine wire 113 and wire carrier or decals 115 and 117. In the depicted embodiment, wire 113 is configured as a current collector to collect current generated by the solar cell and as a solar cell interconnect to electrically connect the cell to another cell, for example, in a solar module. In other solar cell or module configurations, the wire may be configured only as a current collector or only as an interconnect.

Referring again to front view 101, a portion 119 of wire 113 overlays conductive transparent top layer 107, and collects current generated from the cell. Wire 113 is typically a thin, highly conductive metal wire. Examples of wire metals include copper, aluminum, nickel, chrome or alloys thereof. In some embodiments, a nickel coated copper wire is used. The wire should be able to maintain the serpentine form shown without significant material strain. In certain embodiments wire having a gauge of 24 gauge-56 gauge, or in particular embodiments, 32 gauge-56 gauge, for example 40 gauge-50 gauge. Front decal 115 overlays all or part of portion 119. (Back decal 117, which overlies portion 121 of wire 113, is not shown in this view for clarity). Front decal 115 is a transparent, insulating carrier for the conductive wire. Examples of decal materials include thermoplastic materials such as poly(ethylene terephthalate) (PET), ionomer resins, e.g., Surlyn™, polyamde, polyetheretherketone (PEEK), or combinations of these. In certain embodiments, it may not be used.

Figure 3:
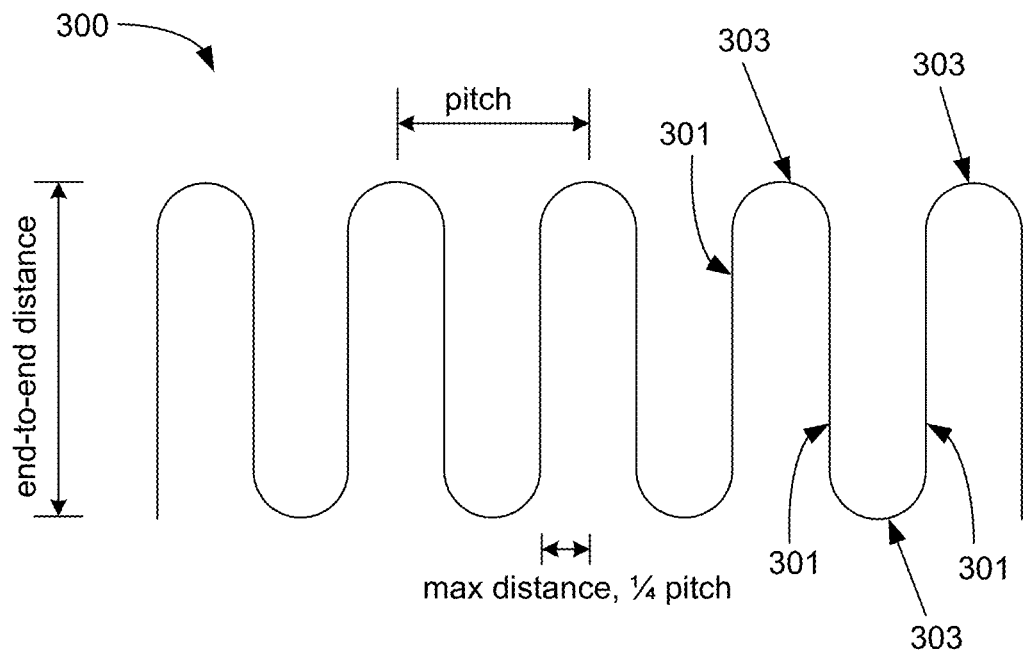
FIG. 3 is a schematic illustration of a section of a serpentine wire according to certain embodiments.

Wire 113 is significantly more conductive than the transparent top layer 107 and so improves current collection. FIG. 3 shows a section 300 of a serpentine wire according to embodiments of the invention. As used herein, the term "serpentine" refers to a form having substantially uniformly spaced, substantially co-extensive and substantially parallel lengths of wire connected via substantially rounded end portions. Uniformly spaced, co-extensive, parallel lengths 301 connected by rounded end portions 303 are indicated in FIG. 3. In other embodiments, the apparatuses and methods described herein may also be used to form wire current collectors having other configurations, e.g., such as angled zig-zag patterns, etc.

The pitch of the serpentine wire, as measured by the distance between the centers of adjacent end portions, determines the distance current travels through the transparent conducting oxide prior to reaching the highly conductive wire. As shown in FIG. 3, the maximum distance current has to travel through the transparent conductive oxide is ¼ pitch. Reducing the pitch increases current collection, however, it also decreases the useful surface area of the cell. In certain embodiments, the pitch is between about 4 and 10 mm, e.g., about 6.5 mm, though other distances may also be used as appropriate.

Figure 4:
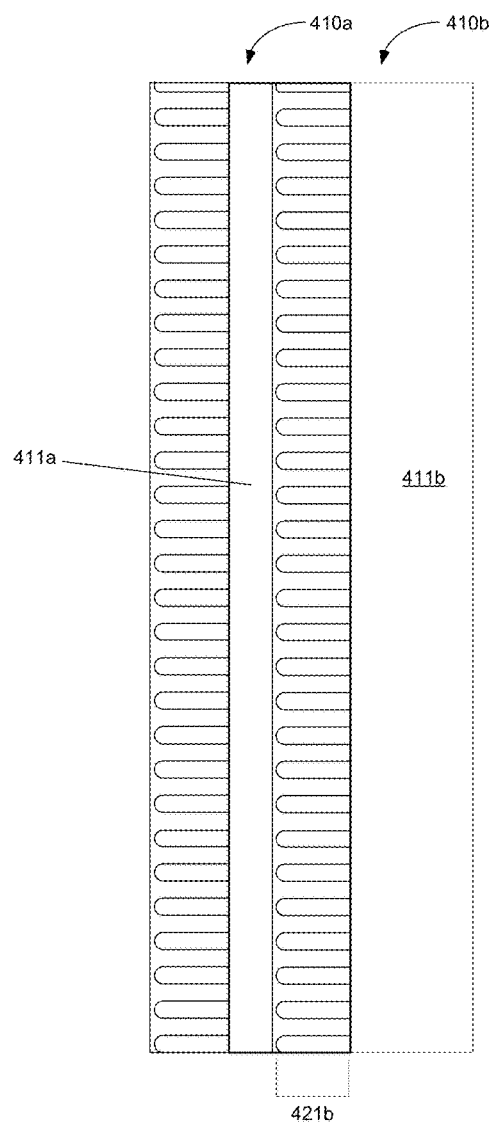
FIG. 4 depicts two interconnected solar cells according to certain embodiments.

Returning to FIG. 1, view 103 depicts metallic substrate 111 and interconnect portion 121 of serpentine wire 113. Back decal 117, which overlies portion 121 of serpentine wire 113 as shown in view 103, is an insulating carrier for serpentine wire 113. In view 103, the conductive side of interconnect portion 121 faces down, able to make contact with a metallic substrate of an adjacent cell. An example is depicted in FIG. 4, which shows the backsides of cells 410a and 410b including metallic substrates 411a and 411b. Wired interconnect 421b of cell 410b overlies metallic substrate 411a of cell 410a, thereby electrically connecting the cells 410a and 410b.

Figure 5:
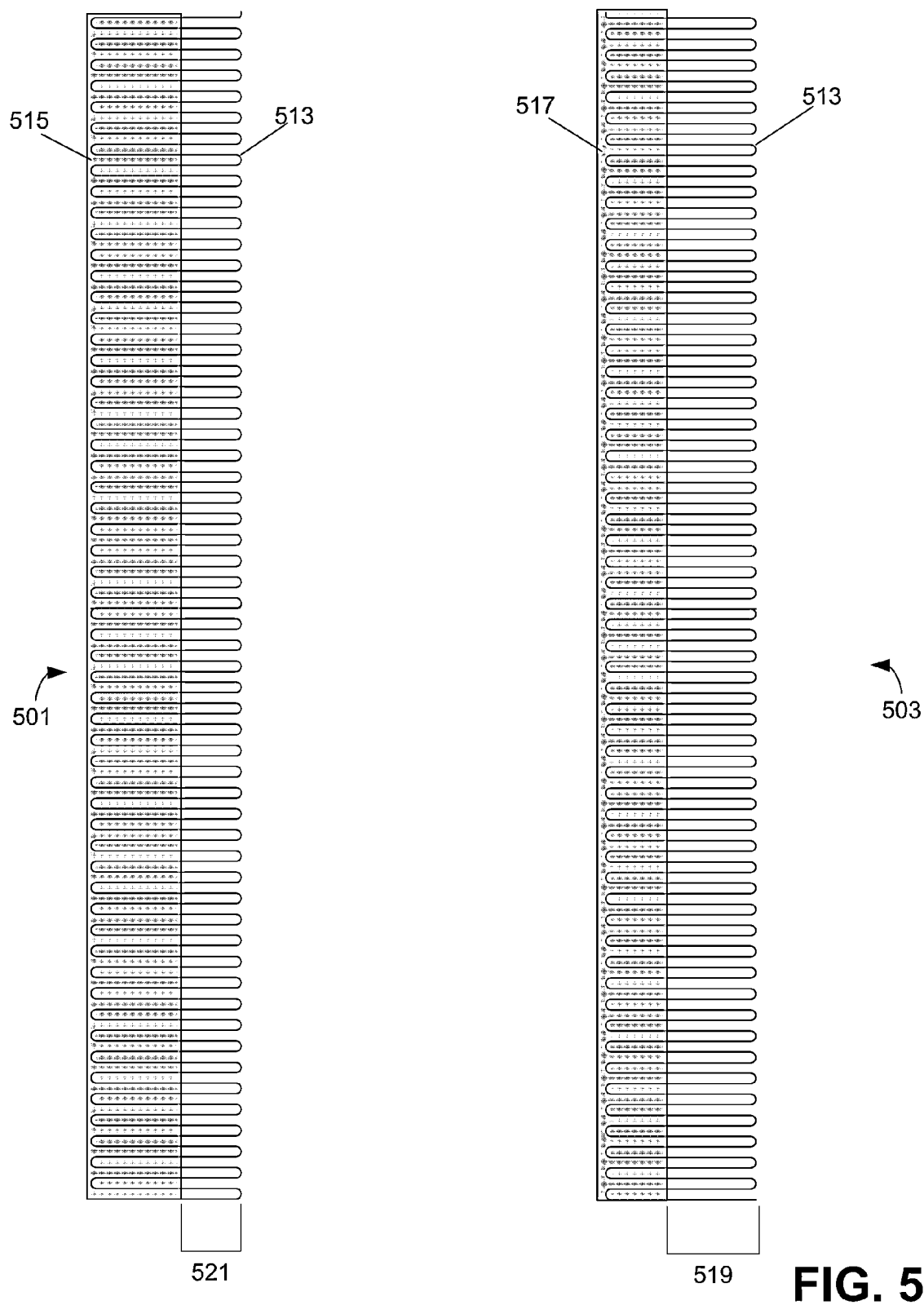
FIG. 5 depicts front and back views of a wire assembly according to certain embodiments.

In certain embodiments, the serpentine wire is provided on an insulating carrier, such as front and back decals described with reference to FIG. 1. FIG. 5 depicts front and back views of a strip of a wire assembly including serpentine wire 513 and front and back decals 515 and 517, respectively. Front view 501 shows serpentine wire 513 and front decal 515, which overlies a portion of wire 513. (Back decal 517 is not depicted in view 501 for clarity.) Exposed portion 521 of wire interconnects the cell as depicted in FIG. 4. Back view 503 shows serpentine wire 513 and back decal 517, which overlies a portion of wire 513. Exposed portion 519 of wire 513 faces the top conducting oxide and acts as a current collector. In certain embodiments, such a wire assembly is affixed to the front side of a cell or cell width strip (such as those shown in FIG. 2). In alternate embodiments, one or more of the decals do not overlie the rounded end portions of the serpentine wire.

Embodiments of the invention provide apparatuses and methods of fabricating serpentine wires and wire assemblies including serpentine wires and insulating carriers, such as that shown in FIG. 5. According to various embodiments, the apparatuses include collapsible link systems with link heads spaced apart when the links are in an uncollapsed or open position and stacked when the links are in a collapsed position. In certain embodiments, the link heads include engaging members configured to engage an unformed wire, with the link heads arranged such that, when collapsed, the wire is threaded through engaging members of the heads in a serpentine configuration.

Figure 6A:
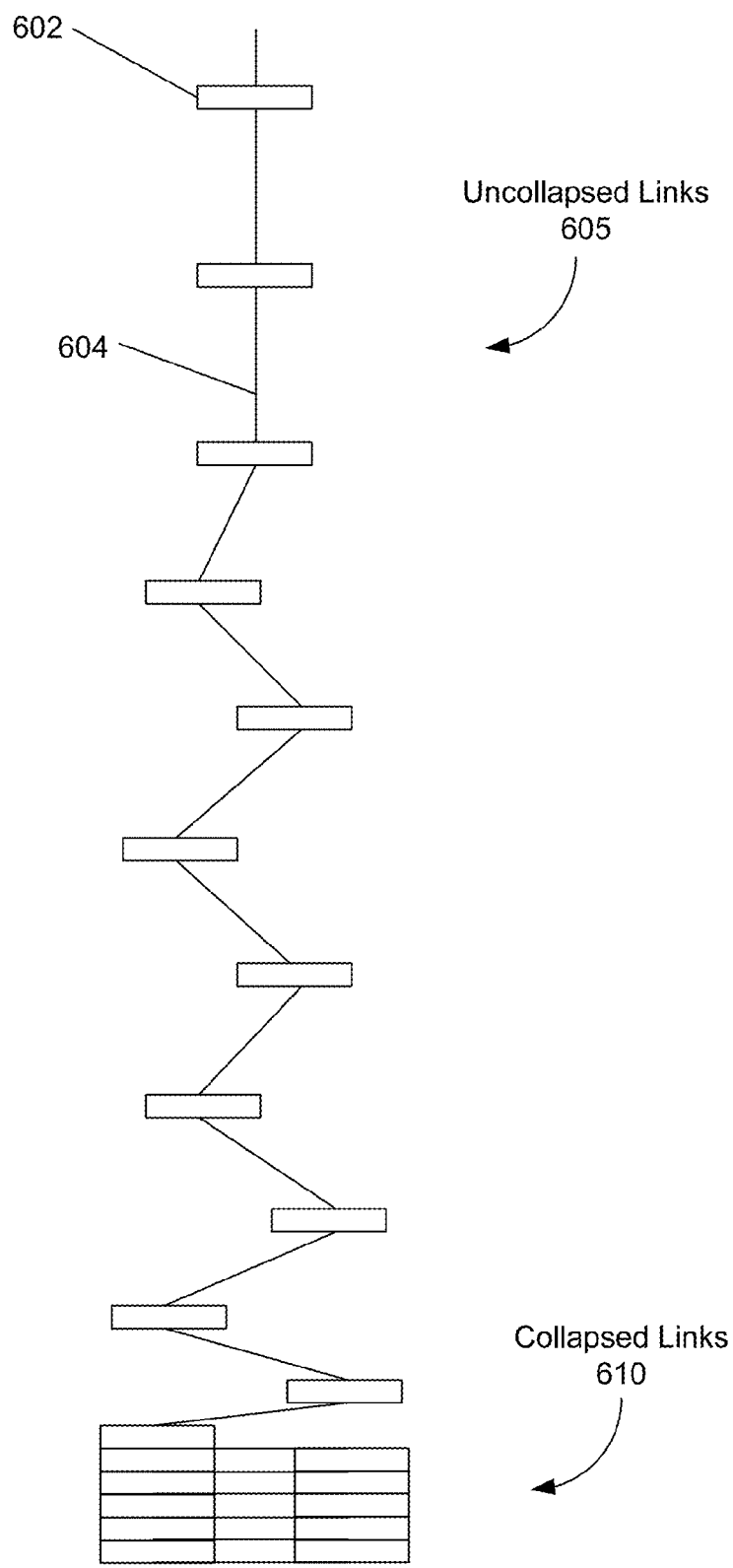
FIG. 6A is a schematic illustration of a section of a collapsible link system during formation of a serpentine wire according to certain embodiments.
Figure 6B:
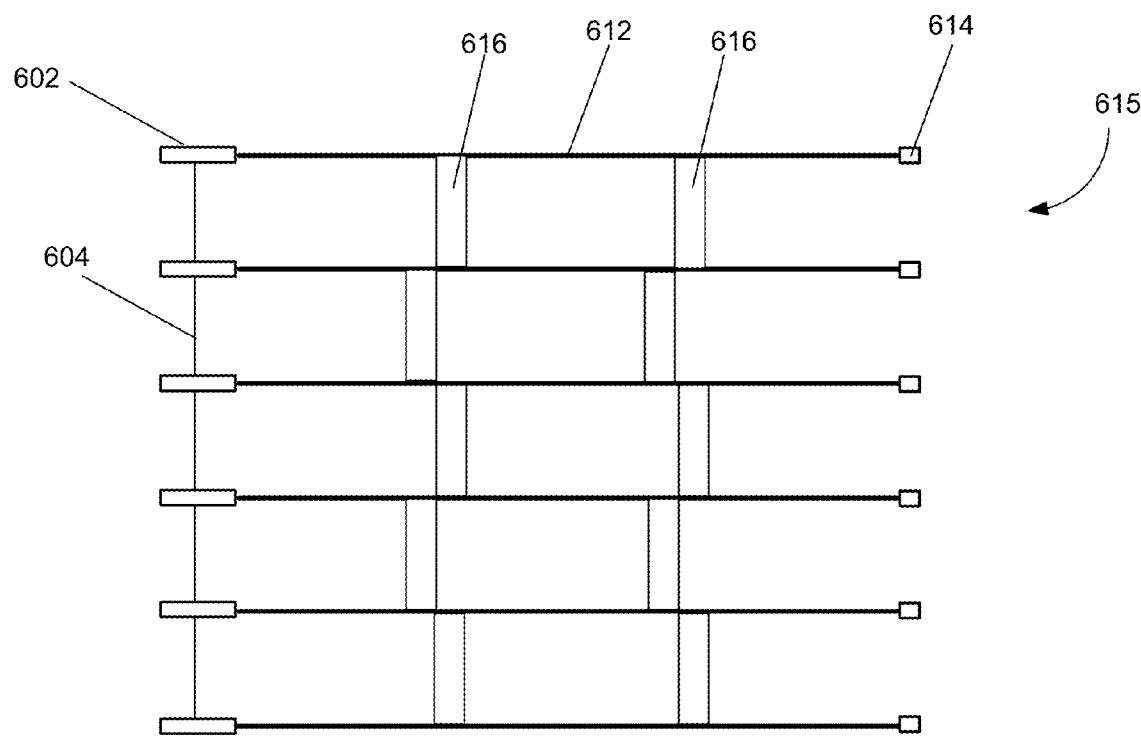
FIG. 6B is a schematic illustration of a several links in uncollapsed and collapsed states according to certain embodiments.
Figure 6B:
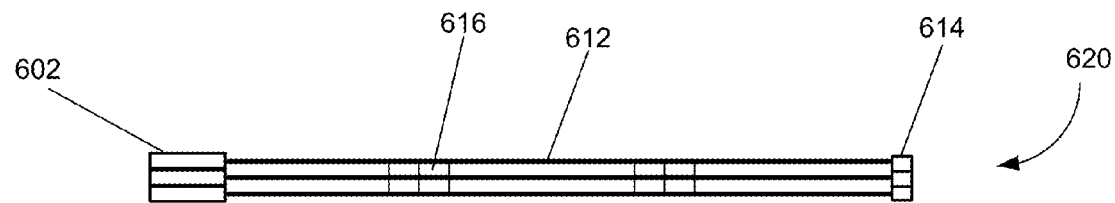

FIG. 6A is a schematic illustrating a section of a collapsible link system during formation of a serpentine wire according to certain embodiments. Link heads 602 engage wire 604. At 605, link heads 602 and wire 604 are shown with the links (not shown) in an uncollapsed state. Link heads 602 are spaced apart and engage wire 604. Wire 604 is unformed and generally straight, e.g., having come off a spool. As the links collapse, adjacent link heads 602 pull away from each other. At 610, link heads 602 and wire 604 are shown with the links in a collapsed state: link heads 602 form two stacks, with link heads that alternate in the uncollapsed state stacked together; wire 604 is in a serpentine configuration. FIG. 6B shows a side view 615 of links 612 including link heads 602 and link feet 614 in an uncollapsed state. Link heads 602 engage wire 604. In certain embodiments, links 612 are connected via one or more swing arms 616. In the depicted embodiment, two swing arms 616 connect adjacent links 612. Swing arms 616 are pivotable around each connected link 612, allowing the links 612 to collapse. At 620, the collapsed links are shown. It should be noted that in certain embodiments, link heads 602 remain oriented horizontally even as the links collapse, allowing the link heads to stack as depicted at 610 in FIG. 6A and 620 in FIG. 6B. If the link heads 602 are permitted to rotate too much during collapse, they could pull on the wire and/or be unable to properly stack.

The below description presents apparatuses including collapsible links for forming serpentine wire interconnects according to various embodiments. The invention is not limited to the particular examples presented below however, and it will be apparent to one of skill in the art that certain changes and modifications may be made without departing from the scope of the invention.

Figure 7:
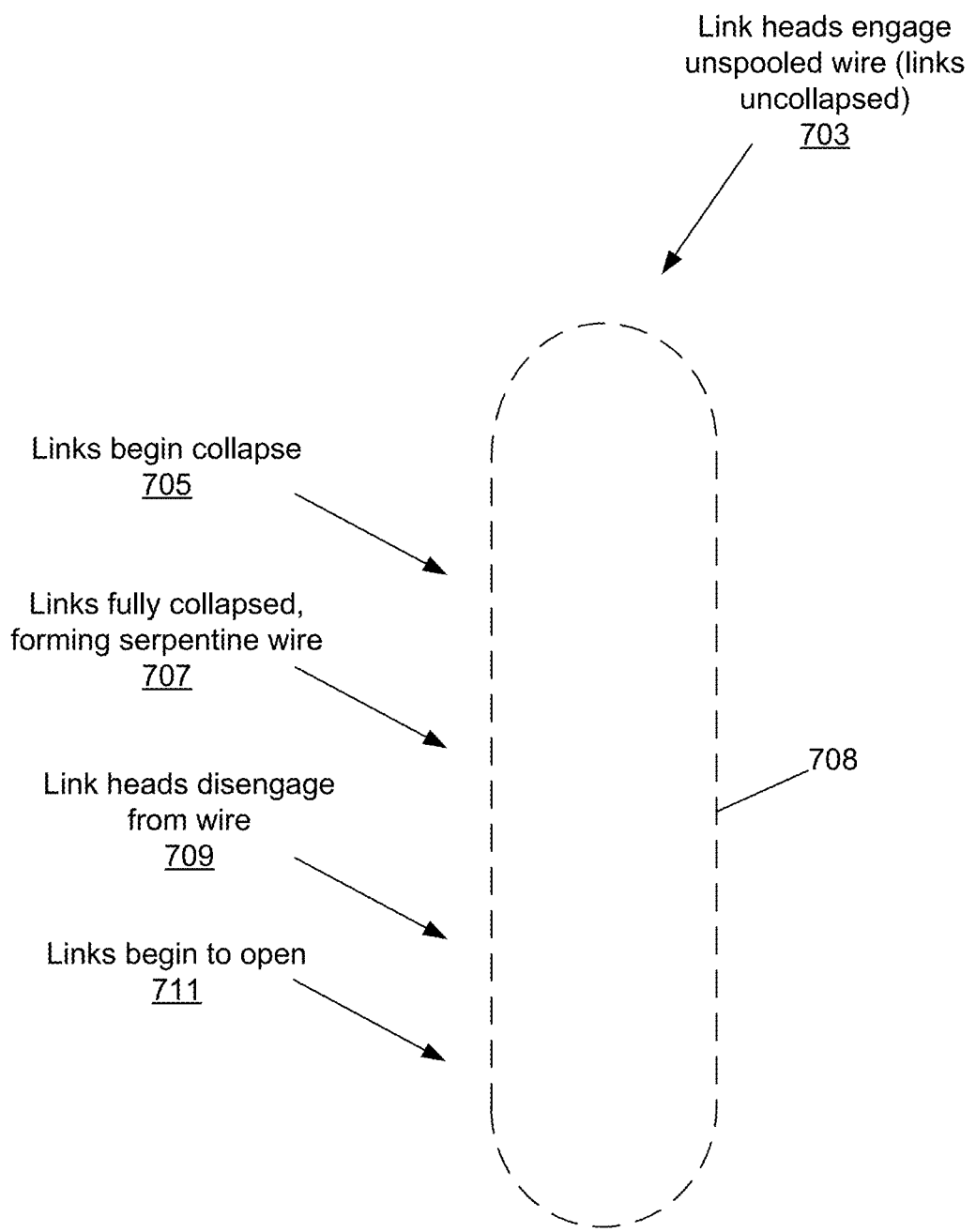
FIG. 7 is a schematic illustration of a recirculation path according to certain embodiments.

In certain embodiments, a high throughput apparatus is provided in which recirculating chain links are collapsed and opened as they circulate around a recirculation path. FIG. 7 is a schematic illustrating a recirculation path 708 and positions along the path at which various operations take place according to certain embodiments. The precise form of a recirculation path and placement of these positions will vary depending on the implementation. A wire (not shown) may be fed to the apparatus, e.g., from a spool. At a position 703, link heads engage the unspooled wire. The links travel around the recirculation path along with the wire. At a position 705, the links begin to collapse, with the links fully collapsed at a position 707. The collapse of the links forms the serpentine wire as depicted in FIGS. 6A and 6B. The link heads then disengage the wire at a position 709, with the serpentine wire fed off the recirculation path 708 for further processing, and the links continuing along path 708. At position 711, the links start to open to receive the unformed wire. As described further below, in certain embodiments the recirculation path includes a wire heating section and a decal application position, with the wire heating section disposed between positions 707 and 709, and the decal application position disposed between the wire heating section and position 709.

Figure 8:
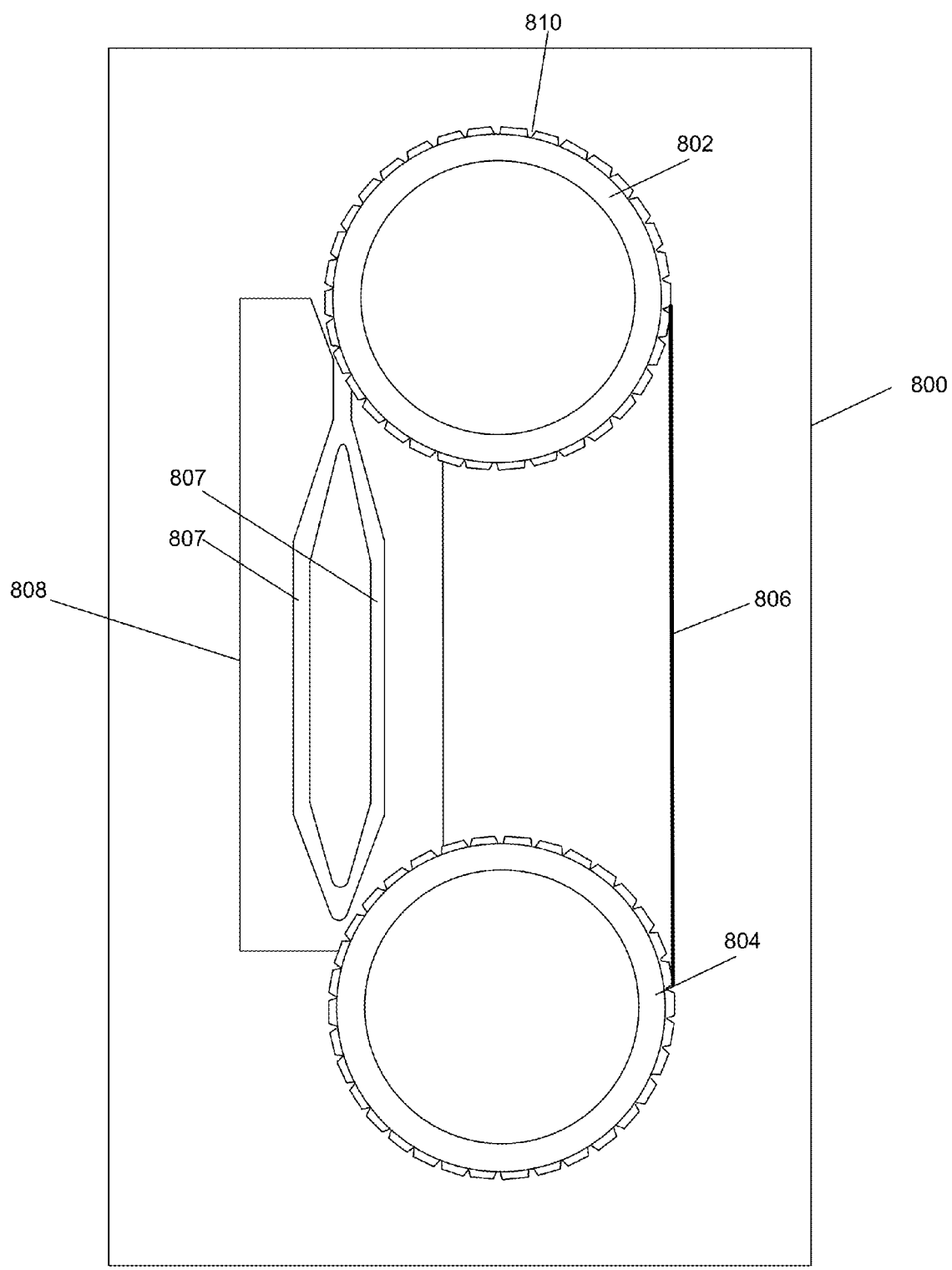
FIG. 8 depicts certain components of an apparatus according to certain embodiments including upper drum, lower drum and guide track.

FIG. 8 shows an example of certain components of an apparatus 800 according to certain embodiments including upper drum 802, lower drum 804, belt 806, and guide track 808. Upper and lower drums 802 and 804 rotate, driving belt 806 and chain (not shown) around the drums. V-shaped grooves 810 on the upper drum 802 receive and align link heads, so that they can engage the unspooled wire. Guide track assembly 808 includes channels 807 to through which links (not shown) extend to guide the links and link heads (not shown) of the chain as they collapse and reopen.

Figures 9A, 9B:
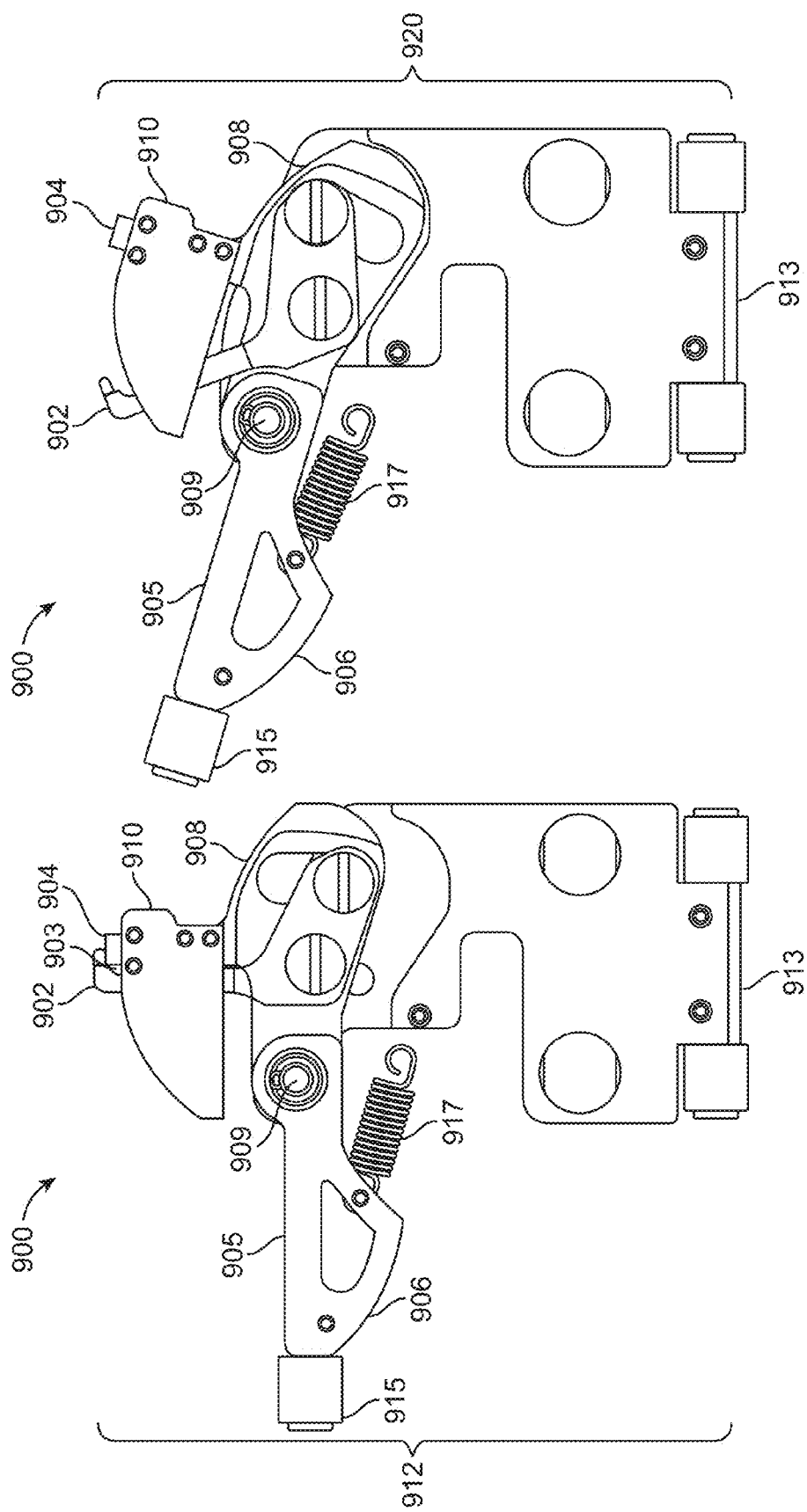
FIGS. 9A and 9B depict link heads according to certain embodiments in open and closed positions.

In certain embodiments, the link heads include engaging members that grab wire at the twelve o'clock position of the upper drum. In certain embodiments, engaging members are opened at a position prior to the twelve o'clock position to grab the wire and are closed thereafter to engage the wire. FIG. 9A shows a link head 900 in a closed position and FIG. 9B in an open position. Link head 900 is connected to a link (not shown) at connection point 913 and may be oriented such that either side 920 or side 912 faces the upper drum. Two engaging members, 902 and 904 cage the wire (not shown) in an area 903. Engaging member 902 includes an L-shaped tip configured to fit over a post of engaging member 904. In certain embodiments, the post of engaging member 904 includes a recess configured to receive a portion of the tip of engaging member 902.

In certain embodiments, engaging member 904 is a metal post, with L-shaped engaging member 902 made of PEEK or other electrically insulative material. Component 910 is also made of PEEK or other electrically insulative materials, as are all parts of the apparatus that contact the wire save for metal post 904. As described below, this is to keep the wire electrically floating relative to ground, enabling current to be used to heat the wire in a wire heating section.

Link head 900 has an activation member 905 including dual activatable surfaces 906 and 908, which are symmetric around pivot point 909. Engaging member 902 is movably connected to activation member 905; engaging member 904 is connected to or part of activation member 905. The link head can be moved to an open position (shown in FIG. 9B) by application of force to either activatable surface 906 or 908. This allows the link head 900 to grab or release a wire regardless of whether the link head is oriented such that side 912 or side 920 faces the upper drum. In an open position member, engaging members 902 and member 904 move away from each other to allow a wire to be inserted or removed. Spring 917 returns the link head 900 to a closed position once the force on the activatable member is removed. The activatable member 905 includes a cylindrical sleeve 915 providing a surface to contact a side guide track channel. The cylindrical sleeve is made of a polymer material having a low coefficient of friction. Similar cylindrical sleeves are disposed around other parts of the links to facilitate quick movement down the track.

The dual activatable link head 900 allows adjacent link heads to be oriented in different directions and grab a straight wire. Such link heads are versatile in that identical link heads can be used to grab the wire from either side of the wire. They also allow the compressed stacked links to be symmetric about a central axis between the stacks. In other embodiments, different link heads are used with adjacent link heads having different configurations and alternating link heads having the same configuration.

Figure 10:
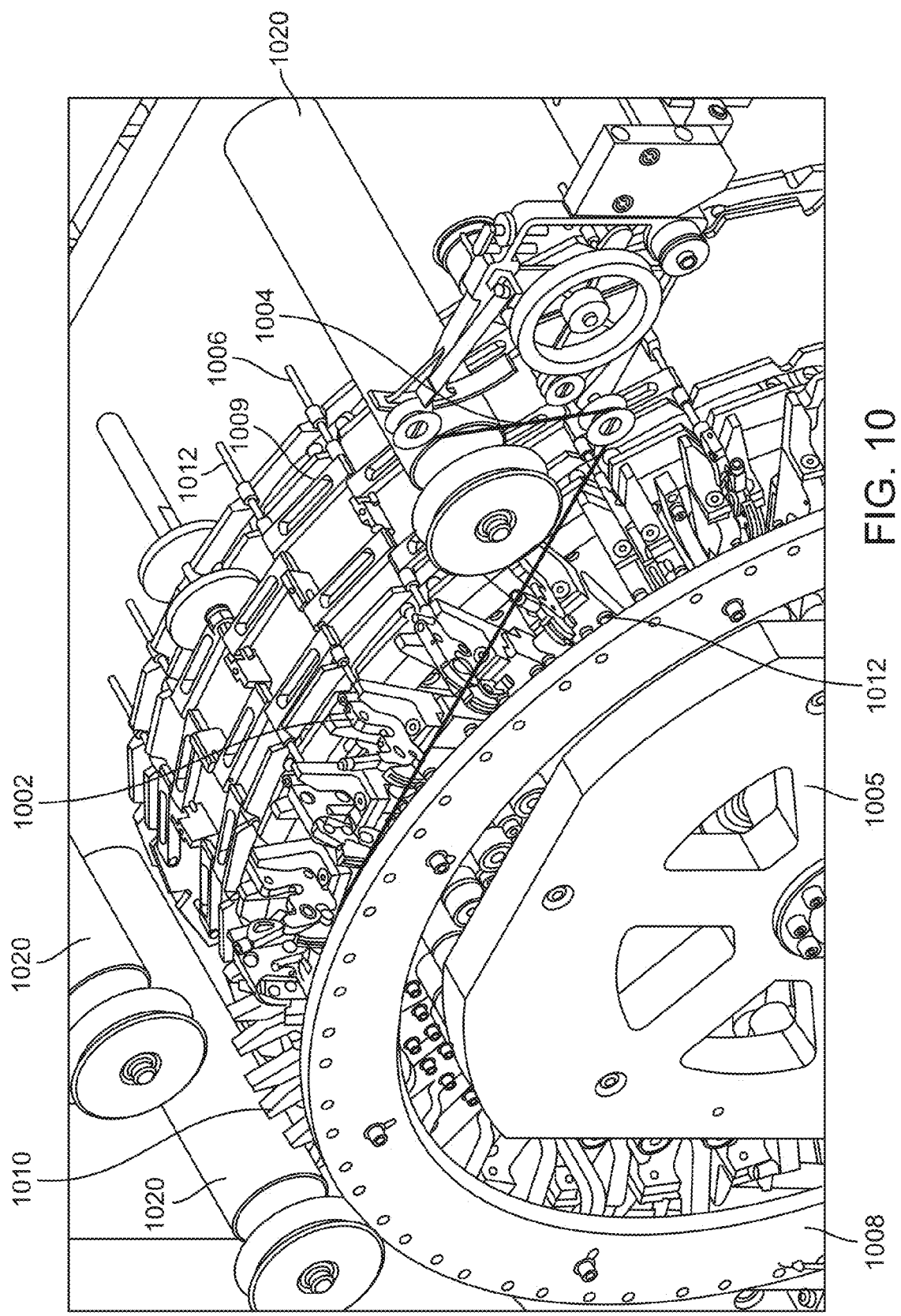
FIG. 10 depicts certain components of an upper drum assembly according to certain embodiments.

FIG. 10 shows a view of certain components of an upper drum assembly including link heads 1002 grabbing a wire 1004 at the twelve o'clock position. Links 1012 include swing arms 1009 and link feet 1006. The upper drum assembly includes cam mounting 1005, halo 1008 and v-shaped grooves 1010. Each link head 1002 fits within a v-shaped groove 1010 as it rotates around the top of the drum. A belt (not shown) circulates around posts 1020, riding over the link heads to keep them within the v-shaped groove. Before each link head 1002 reaches the twelve o'clock position, a stationary cam rail (not shown) mounted on cam mount 1005 activates grabbers (not shown) to activate the activatable surface of each link head that is facing the upper drum assembly. Adjacent link heads are oriented in opposite directions. For example, referring to FIGS. 9A and 9B, link heads having side 912 and engaging member 902 oriented down toward the upper drum assembly alternate with link heads having side 920 and engaging member 904 oriented down toward the drum assembly. Wire 1004 is fed via a tensioning assembly onto wire guides 1012 that protrude from the inner surface of halo 1008 and include a groove to receive and align the wire 1004 between the open engaging members of the link heads 1002. At the twelve o'clock position the wire is positioned such that it is between the open engaging members of the link head 1002 facing it. As the links and wire continue to rotate, the cam rail releases the grabbers from applying force to the activating surfaces, allowing the engaging members to close and engage the wire.

Figure 11:
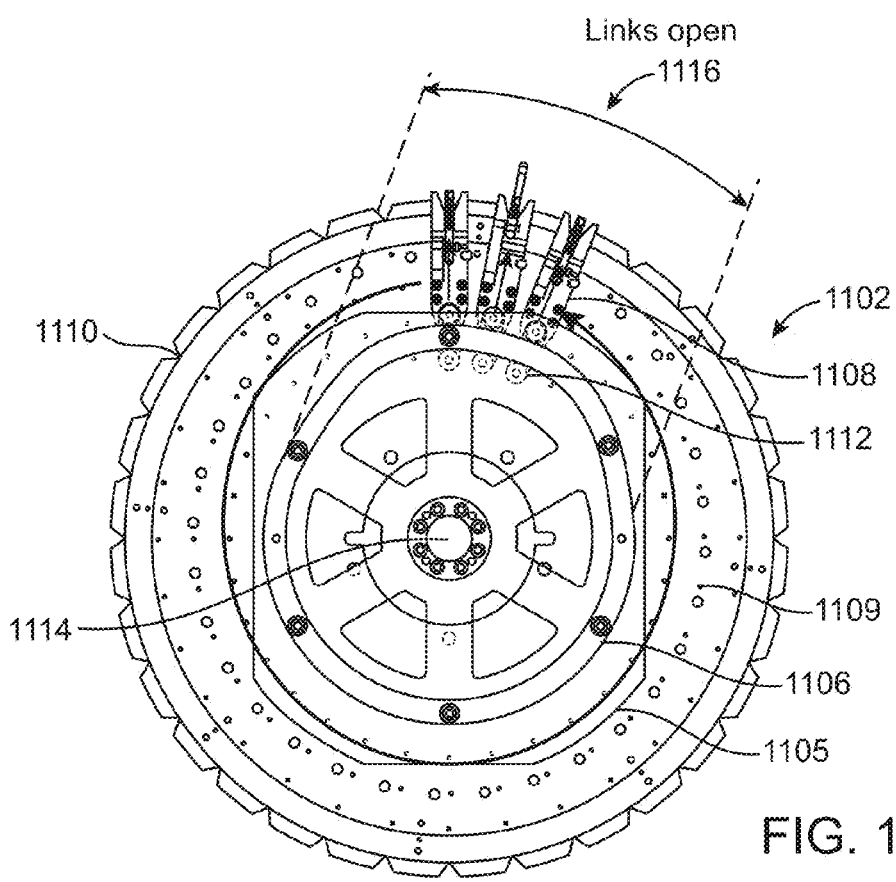
FIG. 11 depicts certain components of an upper drum assembly configured to open and close link heads to grab a wire, according to certain embodiments.
Figure 12A:
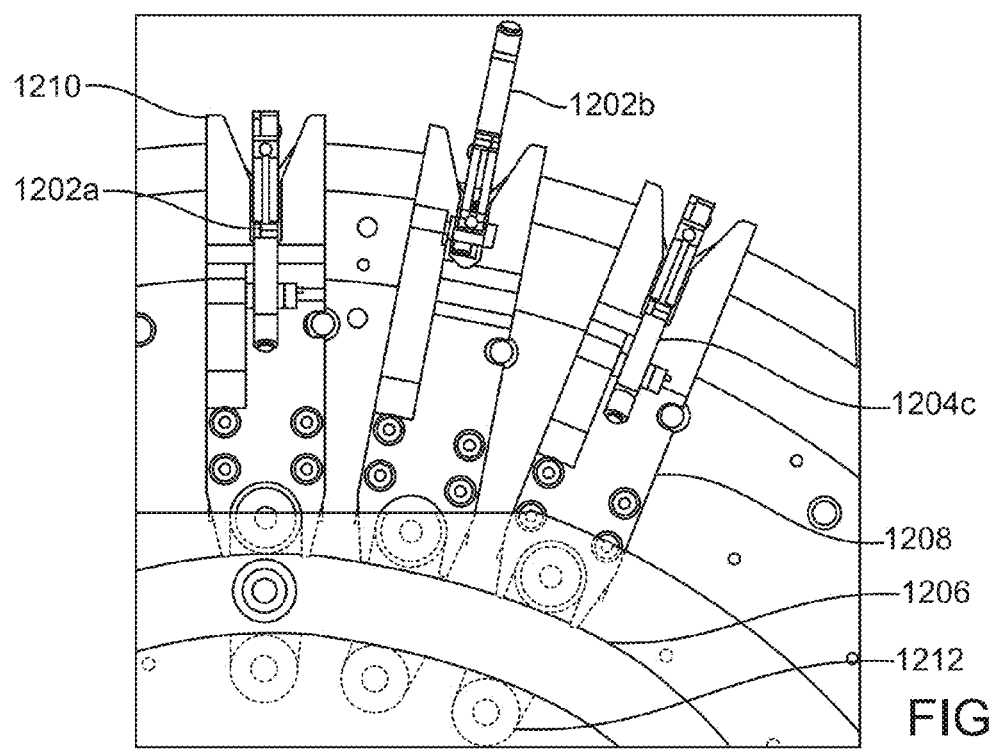
FIGS. 12A and 12B depict close-up views of link heads aligned in v-shaped grooves of an upper drum assembly, as well as grabbers configured to open and close the link heads.
Figure 12B:
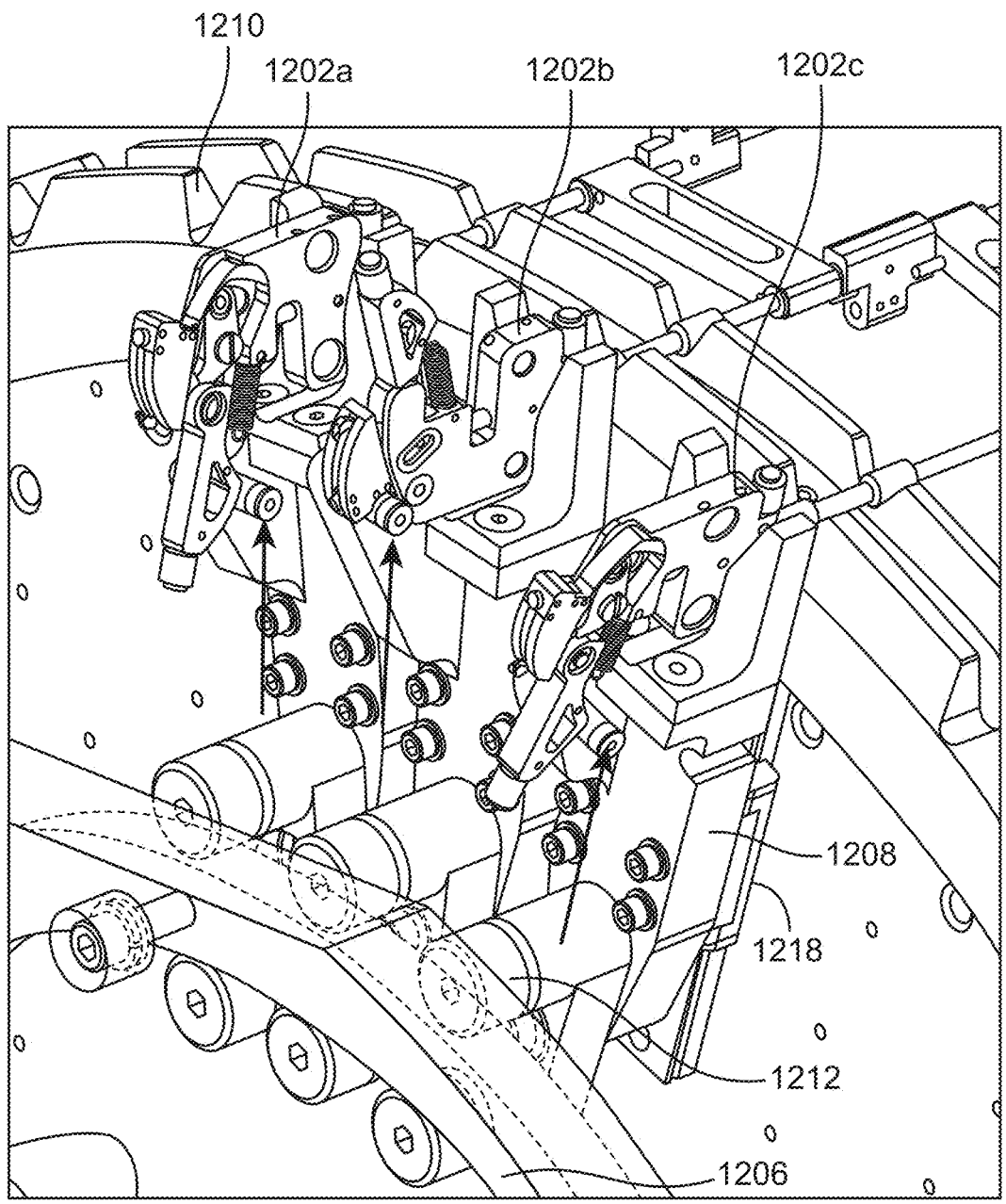

FIGS. 11-12B depicts grabbers activated by an egg-shaped cam rail to open link heads. A grabber opens a link head by pressing on the activatable member facing it. Each v-shaped groove has an associated grabber; for the sake of illustration, only three link heads and grabbers are depicted. FIG. 11 depicts upper drum 1102, cam mounting 1105, cam rail 1106, grabbers 1108, v-shaped grooves 1110 and cam followers 1112. Cam mounting 1105 is on the outside of the cam rail 1106 and upper drum assembly 1102. For clarity, cam mounting 1105 is shown as translucent with cam rail 1106 and three grabbers 1108 visible in FIG. 11. Cam rail 1106 is mounted on cam mounting 1105 such that it faces the rotating upper drum plate 1109. Cam mounting 1105 and cam rail 1106 are centered on central shaft 1114, which does not rotate. The cam rail 1106 is stationary as the upper drum rotates, and is irregularly shaped to force the links open as they rotate through the depicted region 1116.

FIGS. 12A and 12B depict close-up views of grabbers 1208 and link heads 1202a-1202c aligned in v-shaped grooves 1210. Alternating link heads 1202a and 1202c are oriented in the same direction and will eventually collapse to stack together to form the serpentine wire; link head 1202b is oriented in the opposite direction and will for part of the other stack. As discussed above with respect to FIGS. 9A and 9B, an activatable surface of each of the link heads 1202a-1202c faces its respective grabber regardless of the orientation. Grabbers 1208 are in contact with cam follower rollers 1212. As the upper drum, grabbers 1208 and cam follower rollers 1212 rotate, cam follower rollers 1212 follow stationary cam rail 1206. Prior to the 12 o'clock position, cam rail 1206 is shaped to force cam follower rollers 1212 up, forcing grabbers 1208 to slide up linear rail 1218 (shown in FIG. 12B). In this position, grabbers 1208 press on activation surfaces of the link heads, opening the engaging members of the link heads to receive wire at the 12 o'clock position. Cam rail 1206 is such that grabbers 1208 slide back down linear slide 1218 at a point after receiving the wire. The engaging members close around the wire, caging it.

Returning to FIGS. 9A and 9B, the wire is to be enclosed within engaging area 903, but is unconstrained within that area, i.e., it is not pinched by or against members 902 or 904. Other mechanisms for engaging the wire as known in the art may be employed according to various embodiments; however, in certain embodiments, the link heads are configured to cage the wire while allowing it to move within the containment area to prevent undesirable tensions forming between links that could result in irregularities in the formed wire.

After the engaging members close and cage the wire, the links enter the guide track and are collapsed as depicted schematically in FIGS. 6A and 6B. A guide track is employed to guide the link heads and links as they collapse. In certain embodiments, a guide track includes two channels in which the collapsing links are directed, as schematically depicted in FIG. 8. This provides proper alignment of the collapsed links, ensuring uniform and aligned parallel segments of the serpentine wire.

Figure 13:
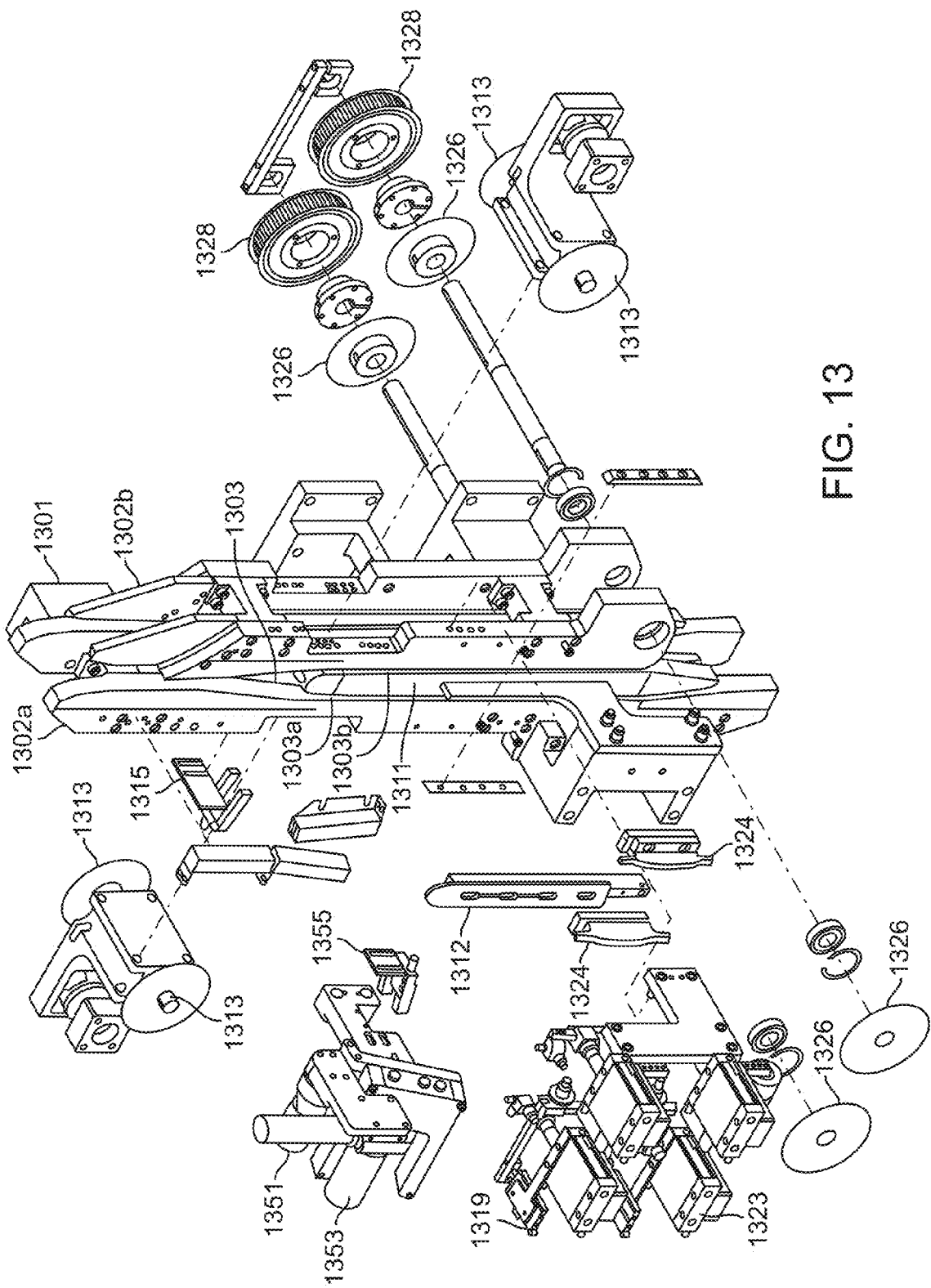
FIG. 13 shows an exploded view of components of a guide track assembly.
Figure 14A:
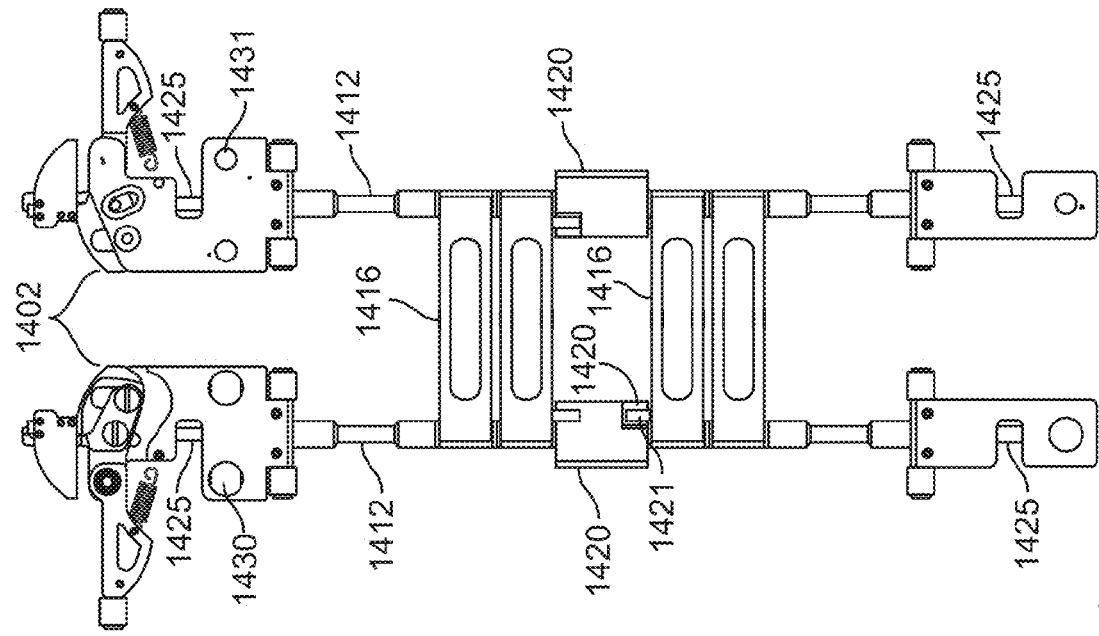
FIG. 14A depicts perspective and side views of two links, including anti-rotation blocks, in a collapsed state.
Figure 14A:
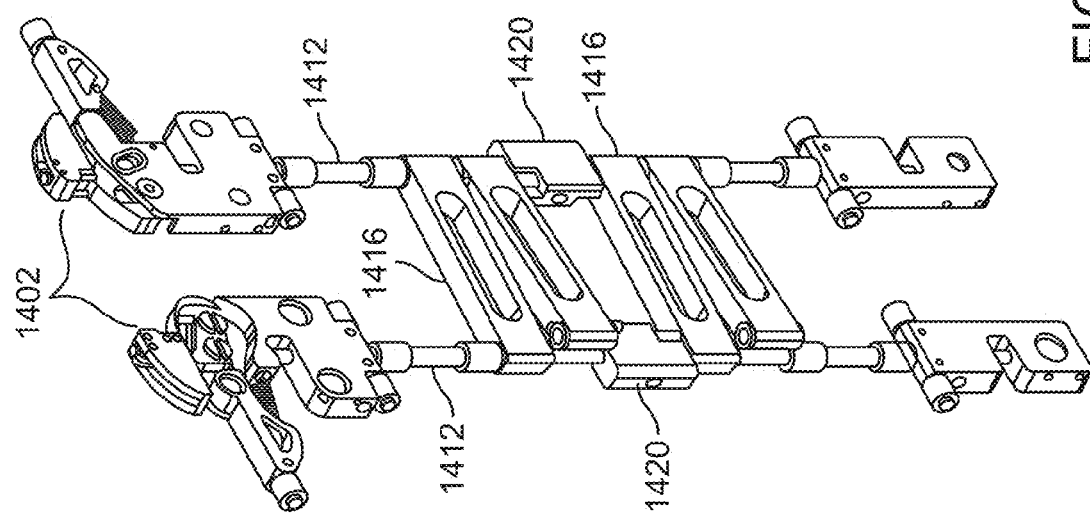
Figure 14B:
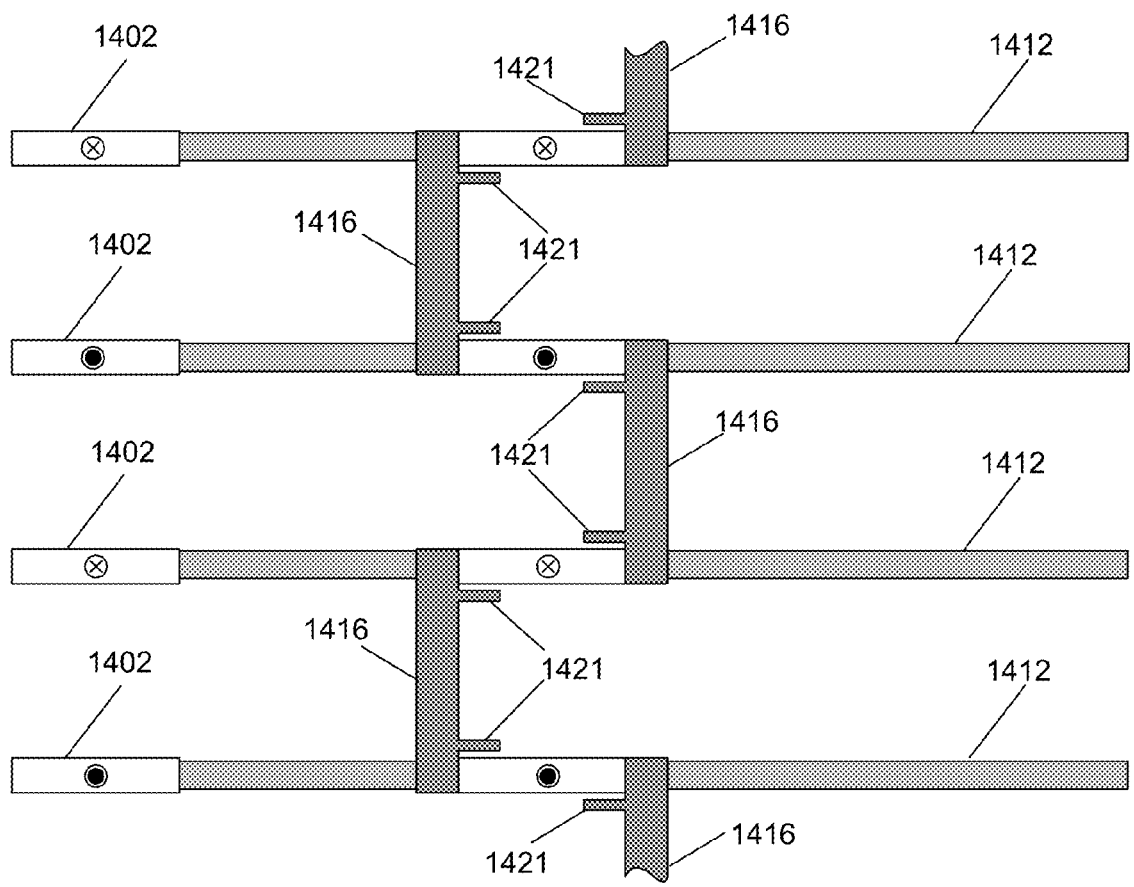
FIG. 14B depicts a schematic of four connected inks, including anti-rotation blocks, in an uncollapsed state.

FIG. 13 shows an exploded view of a guide track assembly. Guide track 1301 includes components 1302a and 1302b, which together define a channel 1303 that the link heads enter as they come off the upper drum. As the link heads come of the upper drum and enter channel 1303, they are oriented generally perpendicular to the length of the channel. It was found that as the links collapse, the naturally tendency of the links heads is to rotate in the direction of collapse, diving downward. This leads to distorted serpentine configurations and induced wire strain, which in turn leads to uneven current collection and power reduction from the solar cells. Embodiments of the present invention keep the link heads horizontal during collapse of the links. FIG. 14A depicts perspective and side views of two links 1412 in a collapsed state, including link heads 1402. The links are connected via pivotable swing arms 1416. (The other swing arms connect the right link to the adjacent link (not shown)). Anti-rotation blocks 1420 on each link 1412 prevent the link 1412 and the link head 1402 from rotating beyond a substantially horizontal position. The swing arms that are adjacent to the anti-rotation blocks 1420 include posts 1421 to that prevent rotation of the anti-rotation blocks 1420, links 1412 and link heads 1402. FIG. 14B depicts a schematic of four connected links 1412 in an uncollapsed state, including swing arms 1416 with posts 1421, and anti-rotation blocks 1420. The alternating orientation of the anti-rotation blocks 1420 and link heads 1402 is indicated by the circled symbols on each. Swing arms 1416 rotate to collapse the links 1412. During collapse, any rotation by a link results in a post 1412 contacting the anti-rotation block 1420 of the link preventing further rotation. Allowable rotation is limited by the distance between the post 1421 and anti-rotation blocks 1420, a distance that may be less than 1 mm in certain embodiments. It has been found that distances of less than about 0.5 mm in certain embodiments sufficiently limit rotation to keep link heads 1402 substantially horizontal. Each anti-rotation block 1420 includes a recess 1423 (seen in FIG. 14A) in each of its opposing major faces to receive a post when the links are collapsed, allowing the anti-rotation blocks 1420 and links 1412 to stack evenly.

Returning to FIG. 13, channel 1303 bifurcates into two channels 1303a and 1303b separated by component 1311. The neck portions of the links are disposed between components 1311 and 1302a or 1302b, such that two stacks of link heads and the engaged wire protrude from the bifurcated channels. Link head spreader 1312 is disposed on component 1311 and serves to spread the link heads. Link head spreader is made of a plastic material, such as a polyurethane ketone or PEEK material. In certain embodiments, the guide track is slightly undersized, that is the distance between channels 1303a and 1303b is less than required for the desired end-to-end length of the serpentine wire, with link head spreader 1312 wider than component 1311, Link head spreader 1312 forces the link heads to the correct distance, making straight, aligned loops of the serpentine configuration.

Four upper drive sprockets 1313 compress the collapsed links to ensure proper alignment and pitch. The sprockets engage pins 1425 shown in FIG. 14 to press down on the links. In certain embodiments, a downward force of about 110 psi is used.

In certain embodiments, a sensor 1315 is used to detect if the link heads are diving down. In certain embodiments, diving is also prevented by the placement of magnets 1317 which exert magnetic force to counter the diving motion. Compression and wire heating assembly 1319 includes pneumatic cylinders 1320 and pistons 1323 to provide anti-diving pneumatic force on collapsed link heads.

Figure 15:
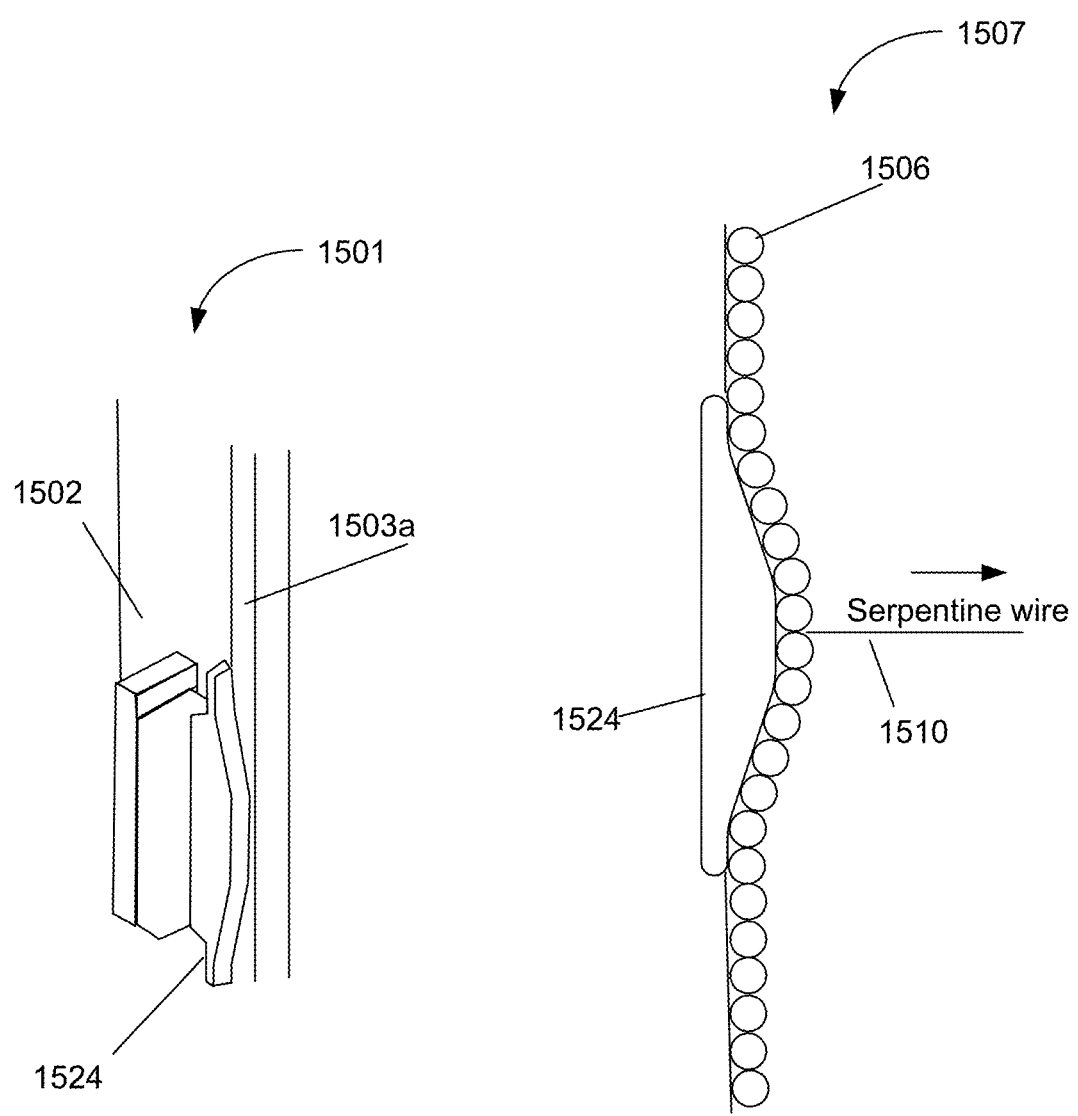
FIG. 15 depicts various views of a wire release cam.

Once the links are collapsed and the serpentine configuration is formed, the link heads pass a dual wire release cam 1324. The dual cams 1324 are employed to activate the activatable members of the link heads to open the engaging members, releasing the serpentine wire. FIG. 15 depicts a view 1501 of cam 1524 mounted on a portion of linear guide assembly 1503 and adjacent to a channel 1502a through which one side of the collapsed links pass. Another such cam is similarly mounted on the other side of the guide track assembly to open the engaging members of the other stack of link heads (not shown). View 1507 shows activatable members 1506 of a stack of link heads: cam 1524 forces the activatable members 1506 up. (Referring to FIGS. 9A and 9B, activatable member 906, on the outside of the stack, is activated by the cam.) The engaging members of the other stack of link heads are also opened by activating activatable members 1506, which are located on the outside of that stack. The wire 1510, now formed in a serpentine configuration, is free to be pulled off for further processing, with the links to continue around the recirculating path. As described above, when activated, the engaging members open away from the plane of the wire, allowing the wire to come off the links free and clear.

Returning to the guide track assembly of FIG. 13, lower link metering sprockets 1326 and drive pulleys 1328 meter the links out after the serpentine wire is released to allow the links to open and return around the lower drum as described above. In certain embodiments, the apparatus includes a decal feed apparatus 1351 to apply a decal 1353 to the serpentine wire.

Figure 16:
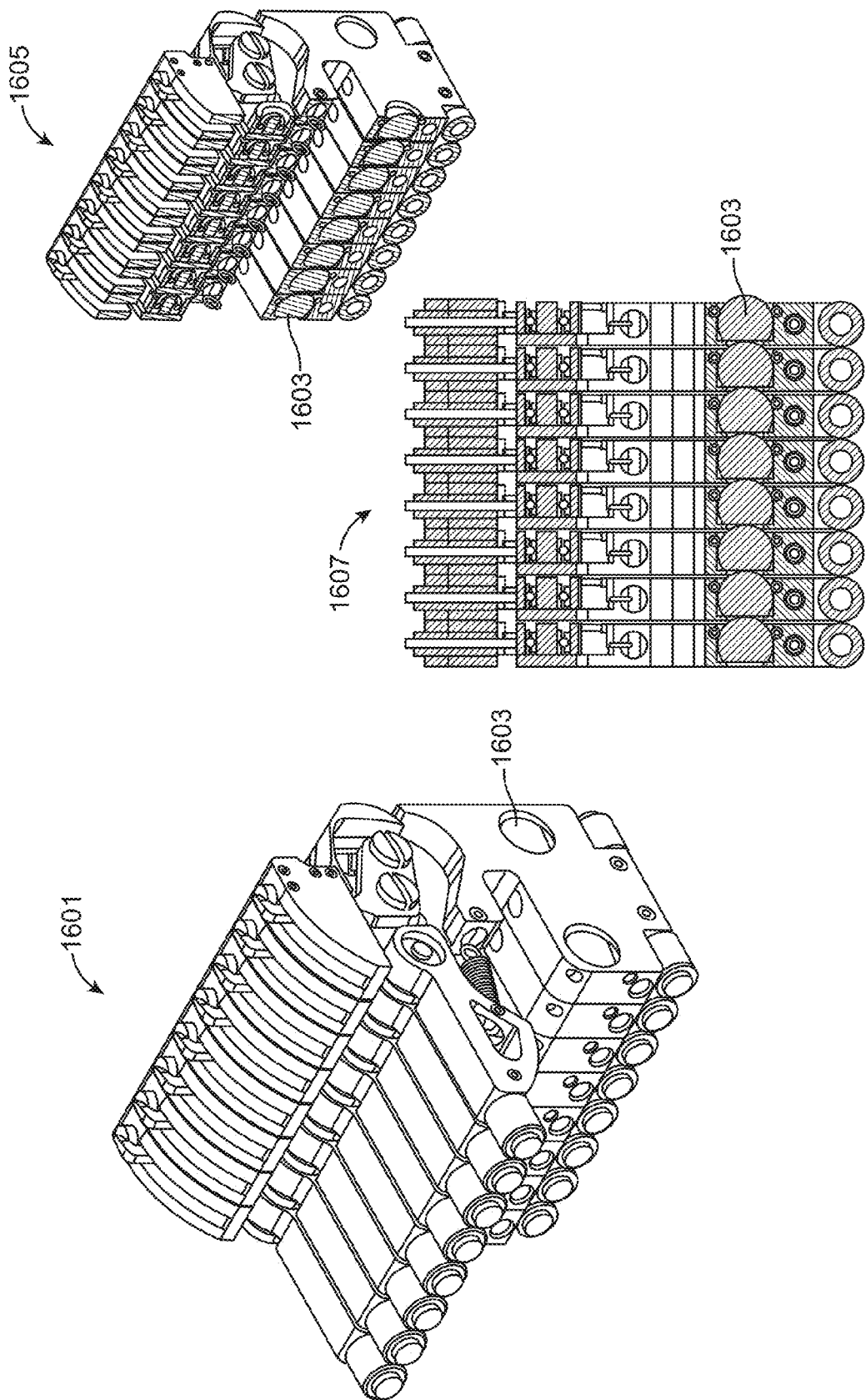
FIG. 16 depicts various views of stacked link heads, including nested balls to set wire pitch.

Wire pitch is determined by stacking of the link heads in their collapsed state. In certain embodiments, each link head includes one or more ball bearings on a first side, and on the opposite side, recesses to receive the ball bearings of the adjacent alternating link head. FIG. 14A shows an example of two adjacent links heads 1402 of opposite orientations. Bearings 1430 of one link head are shown, as are recesses 1431 of the other link head. FIG. 16 presents several views of a stacked set of collapsed heads, illustrating nesting of the bails. An isometric view 1601 of stacked heads, including balls 1603, is shown, (For ease of illustration, the rest of the collapsed link assembly, including links, link feet and the other set of collapsed heads is not depicted). An isometric cut-away view 1605 depicts the link heads and balls 1603. A front view of the cut-away is shown at 1607, including nested balls 1603, protruding on a first side to nest in a recessed portion of the next link in the stack, and machined flat on an opposite side to allow the ball of the next stacked link on the opposite side to rest nest. The nested balls depicted in FIG. 16 provide one mechanism of ensuring a uniform pitch, however, in alternate embodiments, any other stacking configuration may be employed to establish the pitch.

The apparatuses described above are configured to provide uniform serpentine wire from a spool or other source of straight wire at extremely high speeds. Throughput according to various embodiments is as high as 450 meters/hr-1050 meter/hr of serpentine wire. These rates refer to the length of the serpentine configuration, e.g., the length of a decal or other carrier having a serpentine wire affixed to it. To operate at such high throughput, the apparatus is configured for the following: 1) Keeping link heads horizontal as the links collapse. During collapse, the natural tendency of the link heads is to dive down, in the direction of collapse. If this occurs, the uniformity and alignment of the wire is compromised; 2)

Maintaining pitch. Once collapsed, uniform stacking is required for the pitch to be uniform across the entire serpentine configuration. Uneven pitch could result in uneven current collection and sub-optimal efficiency; 3) Maintaining uniform wire tension. If tension is introduced to a portion of the wire, e.g., prior to collapse, the serpentine configuration will be kinked or difficult to form. 4) Uniformly and reliably grab the wire with the link heads at high speeds.

As described above, link heads have a tendency to dive down as the links collapse. To keep the link heads horizontal, the links are equipped with anti-rotation blocks and pneumatic pressure is directed up toward the link heads as the links collapse. In certain embodiments, repulsive or magnetic force may also be used as appropriate. It has been found however, that the use of pneumatic pressure and anti-rotation blocks as described above is sufficient in many embodiments to keep the link heads horizontal. Also, in certain embodiments, an anti-rotation block is sufficient to keep the link heads horizontal without the balancing force.

Pitch is maintained by the machined ball bearings and corresponding recessed receiving areas, as well as a 10 psi force compressing the collapsing links, as described above. The wire is initially fed onto the apparatus via wire guides that set the proper tension. To maintain proper wire tension, the engaging members of the link heads are configured to trap the wire without pinching it. Any wire pinch introduces uneven tension within the wire. Tension is also controlled by the distance between the wire engaging areas on adjacent links. This distance is slightly larger than the desired end-to-end distance of the loops of the serpentine configuration to account for the wire exerting force to pull adjacent link heads together when collapsed. Tension is then introduced in a uniform manner after the serpentine configuration is formed by a link head spreader, as described above. The link head spreader contacts the link heads as close to the wire engaging area as possible, against PEEK surface 910 of engaging member 904 shown in FIG. 9. Any "piano-ing" of the wire that occurs in link collapse (e.g., due to the wire pulling the link heads unevenly) is removed as the link head spreader aligns the link heads. Between 40 and 170 grams of tension is on the wire to correctly form the serpentine configuration.

Uniform and reliable wire grabbing is facilitated by the engaging members moving away from the plane of engagement when activated, allowing the wire be engaged and disengaged freely. Grabbing is also facilitated by a belt (described above with reference to FIG. 10) that keeps the link heads in position during grabbing.

In certain embodiments, the apparatus is configured to apply a decal to one or both sides of the formed serpentine wire. FIG. 13 depicts decal feed assembly 1351 to feed a first decal 1353 to the serpentine configuration. In certain embodiments, decal feed assembly 1351 includes a Fife™ web steering guide and a sensor 1355 to provide feedback on wire positioning, enabling correct alignment to the wire. Decal is fed to contact the formed serpentine wire, and heated such that it becomes adhesive and is affixed to the serpentine wire. In certain embodiments, the decal is heated via the wire, which is in turn heated by passing an electric current through it. In certain embodiments of the apparatus described herein, a wire heating region is provided bounded by two copper rollers that contact the wire.

Figure 17:
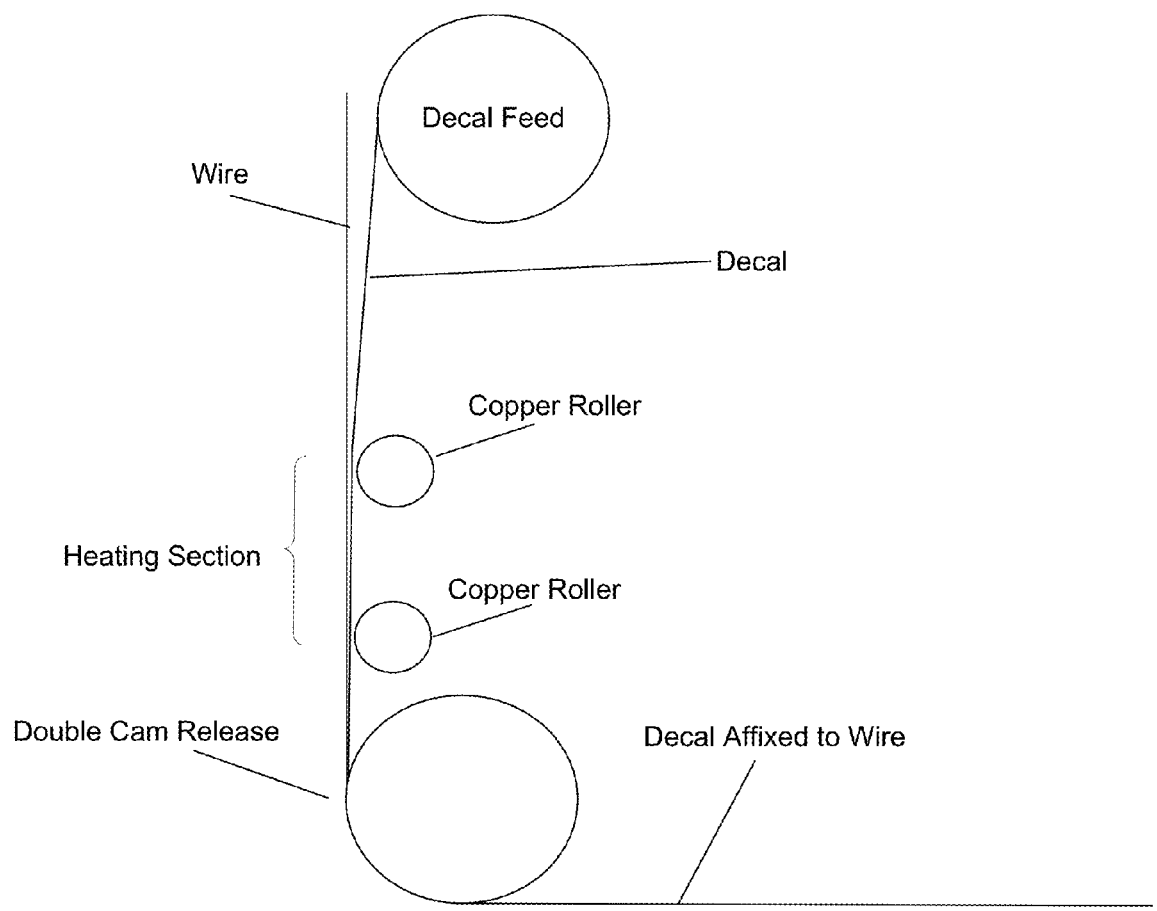
FIG. 17 depicts a schematic of components of a decal application assembly.

An A/C current is run between the two copper rollers, with approximately 90 volts and 8-10 amps used to heat the wire locally over a distance of about, 25 wire loops (total). This allows the hot wire to adhere to the Surlyn portion of the Surlyn/PET/Surlyn (or to any thermoplastic of a decal). FIG. 17 provides a schematic side profile diagram showing location of the heating section. Wire 1701 is shown in side profile, in the guide track (not shown). Decal feed 1702 is depicted, as is decal 1704 as fed from the decal feed 1702. Heating section 1704 is depicted, defined by copper rollers 1706. At the point the links and engaged wire enters the heating section, the links are completely collapsed and the wire is in a serpentine configuration.

An electrical potential is applied to copper rollers 1706, which are positioned to contact the link heads (not shown) of at least one of the two link head stacks to pass an electrical current to the wire via a conductive portion of the link head. Returning to FIG. 9, engaging member 904 is a conductive metal, while L-shaped engaging member 902 is an insulative material. Within engaging area 903, the wire pulls against engaging member 904 when the links are in a collapsed state; current thus passes through engaging member 904 and the wire. The wire 1701 is heated allowing the thermo-adhesive decal to adhere to it.

Now affixed to the decal, the wire 1711 is released from the links via the double cam release 1724 described above with respect to FIG. 15. A roller 1709 facilitates removal of the serpentine wire and affixed decal for further processing. In many embodiments, this includes affixing a second decal to the other side of the serpentine wire as described above with respect to FIG. 5.

Except in the wire heating sections, the wire is always electrically floating relative to ground; all parts of the apparatus that contact the wire, save the metal engaging member, are insulated with PEEK or a similar rigid, insulating material that prevent the wire from contacting ground. The wire outfeed spool, metal guide rings adjacent to the outfeed spool (which are mounted on a PEEK base), the pins on the halo that hold the wire, and the upper portion of the link heads are insulated from ground using PEEK parts.

Although the foregoing invention has been described in some detail for purposes of clarity of understanding, it will be apparent that certain changes and modifications may be practiced within the scope of the invention. For example, in certain embodiments, a non-serpentine uniformly-pitched wire may be fabricated by appropriately adjusting the spacing and diameters of the posts. In this manner, for example, a wire having non-parallel segments connected by rounded ends may be formed. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. An apparatus for forming a serpentine current collector for a solar cell, said apparatus comprising:
   a wire feed apparatus configured to feed wire from a spool;
   a recirculation path comprising a collapsed link section;
   a chain of collapsible links configured to circulate around the recirculation path, wherein the collapsible links of the chain can be in an uncollapsed position or a collapsed position;
   a plurality of link heads connected to collapsible links of the chain of collapsible links; said link heads spaced apart when the collapsible links are in an uncollapsed position and stacked when the collapsible links are in a collapsed position; said link heads configured to engage the wire from the wire feed apparatus; wherein adjacent link heads engage opposite sides of the wire such that, when the links are collapsed, the wire is threaded through engaging members of the heads in a serpentine configuration; and a guide track assembly configured to collapse and guide the links in the collapsed link section of the recirculation path, and further configured to release the formed serpentine wire from the link heads, wherein each link head comprises two engaging members, said members movable between an opened position and a closed position, wherein the members in a closed position define a wire confinement area.

2. The apparatus of claim of claim 1 wherein each link head comprises dual activation surfaces symmetric about a pivot point, wherein a force exerted against either of said activation surface is operable to move the engaging members into the opened position.

3. The apparatus of claim 1 wherein, in the opened position, the engaging members are below the plane of the wire confinement area.

4. The apparatus of claim 1 wherein one of the two engaging members is electrically conductive and the other of the two engaging members is electrically insulative.

5. The apparatus of claim 4 wherein the electrically conductive engaging member is the innermost of the two engaging members when the links are in a collapsed position.

6. The apparatus of claim 1 wherein the link heads are arranged in alternating orientations.

7. The apparatus of claim 1 comprising upper and lower rotatable drum assemblies around which the chain rotates.

8. The apparatus of claim 7 wherein the upper drum assembly comprises v-shaped grooves configured to receive and align link heads.

9. The apparatus of claim 8 wherein each link head comprises two engaging members, said members movable between an opened position and a closed position, wherein the members in a closed position define a wire confinement area.

10. The apparatus of claim 9 wherein upper drum assembly comprises a stationary cam rail and grabbers configured to activate the link heads in the v-shaped grooves to thereby move the engaging members into an opened position.

11. The apparatus of claim 7 wherein the upper drum assembly comprises a halo, said halo comprising protruding wire guides to receive the wire from the wire feed apparatus.

12. The apparatus of claim 1 wherein the guide track assembly comprises a bifurcated channel, said bifurcated channel comprising two sub-channels, each sub-channel configured to guide a stack of link heads.

13. The apparatus of claim 12 wherein the guide track assembly further comprises a link head spreader disposed between the two sub-channels configured to align links of each of two stacks of link heads.

14. The apparatus of claim 1 wherein the guide track assembly comprises a double cam assembly configured to open collapsed link heads to release the serpentine wire.

15. The apparatus of claim 1 wherein the recirculation path further comprises a heating section in which the wire is heated.

16. The apparatus of claim 1 further comprises a decal feed configured to apply a decal to one side of the serpentine wire.

17. The apparatus of claim 1 wherein the links comprises anti-rotation blocks.

18. The apparatus of claim 1 further comprising a set of upper sprockets configured to compress the collapsed links.

19. The apparatus of claim 18 where in the upper sprockets exert pressure of at least about 10 psi on the collapsed links.

20. The apparatus of claim 1 further comprising pneumatic cylinders configured to exert pneumatic force on the link heads to reduce link head diving during link collapse.

* * * * *